US008746170B2

(12) United States Patent
Orito et al.

(10) Patent No.: US 8,746,170 B2
(45) Date of Patent: *Jun. 10, 2014

(54) SUBSTRATE PROCESS APPARATUS, SUBSTRATE PROCESS METHOD, AND COMPUTER READABLE STORAGE MEDIUM

(75) Inventors: Kohichi Orito, Iwate (JP); Manabu Honma, Iwate (JP); Tatsuya Tamura, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 285 days.

This patent is subject to a terminal disclaimer.

(21) Appl. No.: 12/916,667

(22) Filed: Nov. 1, 2010

(65) Prior Publication Data

US 2011/0100489 A1 May 5, 2011

(30) Foreign Application Priority Data

Nov. 4, 2009 (JP) ................................. 2009-253321

(51) Int. Cl.
*C23C 16/52* (2006.01)
*C23C 16/458* (2006.01)
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl.
USPC ........... 118/663; 118/695; 118/698; 118/719; 156/345.24; 156/345.26; 156/345.31

(58) Field of Classification Search
USPC ............. 118/663, 695, 698, 719; 156/345.24, 156/345.26, 345.31
See application file for complete search history.

(56) References Cited

U.S. PATENT DOCUMENTS

| 4,313,783 | A | * | 2/1982 | Davies et al. ................. 438/716 |
| 4,466,380 | A | * | 8/1984 | Jansen et al. .................. 118/712 |
| 4,681,773 | A | * | 7/1987 | Bean .......................... 427/255.5 |
| 4,879,970 | A | * | 11/1989 | Barkalow et al. ............. 118/719 |
| 5,015,327 | A | * | 5/1991 | Taguchi et al. .................... 117/3 |
| 5,070,813 | A | * | 12/1991 | Sakai et al. .................... 118/695 |
| 5,095,300 | A | * | 3/1992 | Alexander et al. ......... 340/686.5 |
| 5,266,119 | A | * | 11/1993 | Taniguchi et al. ............ 118/730 |

(Continued)

FOREIGN PATENT DOCUMENTS

| JP | 3144664 | | 3/2001 |
| JP | 2006057162 | A * | 3/2006 |

(Continued)

*Primary Examiner* — Rudy Zervigon
(74) *Attorney, Agent, or Firm* — IPUSA, PLLC

(57) ABSTRACT

A vacuum chamber is evacuated through a first evacuation passage provided with a first valve and a second evacuation passage provided with a second valve. An opening degree of the first valve is adjusted so that a pressure in the vacuum chamber becomes substantially equal to a process pressure P; an opening degree of a butterfly valve further provided in the second evacuation passage is adjusted to substantially equal to a set value determined by a table in order to set flow rates of gases to be evacuated through the first evacuation passage and the second evacuation passage to be substantially equal to corresponding set values determined by the recipe; and an opening degree of the second valve is adjusted so that a measurement value of a differential pressure gauge further provided in the second evacuation passage becomes substantially equal to a differential pressure written in the table.

6 Claims, 22 Drawing Sheets

(56) References Cited

U.S. PATENT DOCUMENTS

| | | | |
|---|---|---|---|
| 5,302,209 A * | 4/1994 | Maeda et al. | 118/719 |
| 5,314,574 A * | 5/1994 | Takahashi | 438/706 |
| 5,338,362 A * | 8/1994 | Imahashi | 118/719 |
| 5,500,256 A * | 3/1996 | Watabe | 427/579 |
| 5,540,821 A * | 7/1996 | Tepman | 204/192.13 |
| 5,769,950 A * | 6/1998 | Takasu et al. | 118/715 |
| 5,807,792 A * | 9/1998 | Ilg et al. | 438/758 |
| 5,851,293 A * | 12/1998 | Lane et al. | 118/715 |
| 5,855,681 A | 1/1999 | Maydan et al. | 118/719 |
| 5,902,088 A * | 5/1999 | Fairbairn et al. | 414/217 |
| 5,909,994 A * | 6/1999 | Blum et al. | 414/217 |
| 5,911,834 A * | 6/1999 | Fairbairn et al. | 134/1.3 |
| 5,976,989 A * | 11/1999 | Ishiguro | 438/758 |
| 6,120,609 A * | 9/2000 | Selyutin et al. | 118/728 |
| 6,143,080 A * | 11/2000 | Bartholomew et al. | 118/718 |
| 6,143,082 A * | 11/2000 | McInerney et al. | 118/719 |
| 6,203,619 B1 * | 3/2001 | McMillan | 118/715 |
| 6,217,937 B1 * | 4/2001 | Shealy | 427/255.25 |
| 6,235,656 B1 * | 5/2001 | Clarke | 438/800 |
| 6,267,075 B1 * | 7/2001 | Moffat et al. | 118/723 E |
| 6,319,553 B1 * | 11/2001 | McInerney et al. | 427/250 |
| 6,413,321 B1 * | 7/2002 | Kim et al. | 118/725 |
| 6,562,141 B2 * | 5/2003 | Clarke | 118/719 |
| 6,591,850 B2 * | 7/2003 | Rocha-Alvarez et al. | 137/9 |
| 6,634,314 B2 * | 10/2003 | Hwang et al. | 118/723 R |
| 6,635,115 B1 * | 10/2003 | Fairbairn et al. | 118/719 |
| 6,752,874 B2 * | 6/2004 | Shim et al. | 118/719 |
| 6,761,770 B2 * | 7/2004 | Bartholomew et al. | 118/708 |
| 6,806,211 B2 * | 10/2004 | Shinriki et al. | 438/785 |
| 6,807,971 B2 * | 10/2004 | Saito et al. | 134/22.11 |
| 6,812,157 B1 * | 11/2004 | Gadgil | 438/763 |
| 6,843,882 B2 * | 1/2005 | Janakiraman et al. | 156/345.29 |
| 6,863,019 B2 * | 3/2005 | Shamouilian et al. | 118/723 R |
| 6,869,641 B2 | 3/2005 | Schmitt | |
| 6,872,421 B2 * | 3/2005 | Hwang et al. | 427/248.1 |
| 6,962,644 B2 * | 11/2005 | Paterson et al. | 156/345.28 |
| 6,972,055 B2 * | 12/2005 | Sferlazzo | 118/719 |
| 7,020,981 B2 * | 4/2006 | Shero et al. | 34/366 |
| 7,052,576 B2 * | 5/2006 | Park et al. | 156/345.24 |
| 7,153,542 B2 * | 12/2006 | Nguyen et al. | 427/248.1 |
| 7,273,526 B2 * | 9/2007 | Shinriki et al. | 118/715 |
| 7,276,122 B2 * | 10/2007 | Devine et al. | 118/719 |
| 7,422,636 B2 * | 9/2008 | Ishizaka | 118/719 |
| 7,511,814 B2 * | 3/2009 | Otsuki et al. | 356/338 |
| 7,515,264 B2 * | 4/2009 | Otsuki et al. | 356/338 |
| 7,566,891 B2 * | 7/2009 | Rocha-Alvarez et al. | 250/504 R |
| 7,589,336 B2 * | 9/2009 | Kaszuba et al. | 250/504 R |
| 7,647,886 B2 * | 1/2010 | Kubista et al. | 118/666 |
| 7,655,092 B2 * | 2/2010 | Fairbairn et al. | 118/719 |
| 7,663,121 B2 * | 2/2010 | Nowak et al. | 250/455.11 |
| 7,763,115 B2 * | 7/2010 | Hatanaka et al. | 118/719 |
| 7,777,198 B2 * | 8/2010 | Rocha-Alvarez et al. | 250/455.11 |
| 7,794,546 B2 * | 9/2010 | Li | 118/733 |
| 7,828,900 B2 * | 11/2010 | Hatanaka et al. | 118/719 |
| 7,861,668 B2 * | 1/2011 | Toyoda et al. | 118/723 E |
| 7,894,059 B2 * | 2/2011 | Otsuki et al. | 356/337 |
| 7,909,595 B2 * | 3/2011 | Kaszuba et al. | 425/174.4 |
| 7,931,945 B2 * | 4/2011 | Otsuki et al. | 427/576 |
| 7,964,858 B2 * | 6/2011 | Yang et al. | 250/504 R |
| 8,012,261 B2 * | 9/2011 | Sneh | 118/733 |
| 8,020,514 B2 * | 9/2011 | Toyoda et al. | 118/723 E |
| 8,034,723 B2 * | 10/2011 | Ohizumi et al. | 438/758 |
| 8,043,432 B2 * | 10/2011 | Dip | 118/719 |
| 8,066,815 B2 * | 11/2011 | Devine et al. | 118/719 |
| 8,093,072 B2 * | 1/2012 | Ishimaru | 438/14 |
| 8,100,147 B2 * | 1/2012 | Otsuki et al. | 137/896 |
| 8,176,871 B2 * | 5/2012 | Okuda et al. | 118/723 E |
| 8,187,679 B2 * | 5/2012 | Dickey et al. | 427/569 |
| 8,197,636 B2 * | 6/2012 | Shah et al. | 156/345.32 |
| 2001/0007244 A1 * | 7/2001 | Matsuse | 118/719 |
| 2002/0000194 A1 * | 1/2002 | Clarke | 118/715 |
| 2002/0034595 A1 * | 3/2002 | Tometsuka | 427/569 |
| 2002/0056414 A1 * | 5/2002 | Shim et al. | 118/719 |
| 2002/0088547 A1 * | 7/2002 | Tomoyasu et al. | 156/345.47 |
| 2003/0070618 A1 * | 4/2003 | Campbell et al. | 118/715 |
| 2003/0094134 A1 * | 5/2003 | Minami | 118/715 |
| 2003/0094136 A1 * | 5/2003 | Bartholomew et al. | 118/715 |
| 2003/0139035 A1 * | 7/2003 | Yim et al. | 438/643 |
| 2004/0025786 A1 * | 2/2004 | Kontani et al. | 118/715 |
| 2004/0026037 A1 * | 2/2004 | Shinriki et al. | 156/345.33 |
| 2004/0052972 A1 * | 3/2004 | Schmitt | 427/569 |
| 2004/0055636 A1 * | 3/2004 | Rocha-Alvarez et al. | 137/9 |
| 2004/0187784 A1 * | 9/2004 | Sferlazzo | 118/719 |
| 2005/0084610 A1 * | 4/2005 | Selitser | 427/248.1 |
| 2005/0145333 A1 * | 7/2005 | Kannan et al. | 156/345.24 |
| 2005/0189074 A1 * | 9/2005 | Kasai et al. | 156/345.33 |
| 2005/0241579 A1 * | 11/2005 | Kidd | 118/715 |
| 2005/0247265 A1 * | 11/2005 | Devine et al. | 118/719 |
| 2005/0268852 A1 * | 12/2005 | Hatanaka et al. | 118/723 VE |
| 2006/0124058 A1 * | 6/2006 | Sakai et al. | 118/715 |
| 2006/0177579 A1 * | 8/2006 | Shin et al. | 427/248.1 |
| 2006/0213439 A1 * | 9/2006 | Ishizaka | 118/715 |
| 2006/0249175 A1 * | 11/2006 | Nowak et al. | 134/1 |
| 2006/0251827 A1 * | 11/2006 | Nowak et al. | 427/558 |
| 2006/0260544 A1 * | 11/2006 | Toyoda et al. | 118/715 |
| 2007/0116873 A1 * | 5/2007 | Li et al. | 427/248.1 |
| 2007/0209590 A1 * | 9/2007 | Li | 118/719 |
| 2007/0212484 A1 * | 9/2007 | Li | 427/248.1 |
| 2007/0218701 A1 | 9/2007 | Shimizu et al. | |
| 2007/0218702 A1 * | 9/2007 | Shimizu et al. | 438/758 |
| 2007/0286963 A1 * | 12/2007 | Rocha-Alvarez et al. | 427/508 |
| 2008/0026162 A1 * | 1/2008 | Dickey et al. | 427/569 |
| 2008/0075858 A1 * | 3/2008 | Koh | 427/255.28 |
| 2008/0121180 A1 * | 5/2008 | Kontani et al. | 118/723 R |
| 2008/0202423 A1 * | 8/2008 | Hatanaka et al. | 118/723 VE |
| 2008/0241384 A1 * | 10/2008 | Jeong et al. | 427/255.29 |
| 2008/0251014 A1 * | 10/2008 | Kontani et al. | 118/715 |
| 2008/0251015 A1 * | 10/2008 | Kontani et al. | 118/715 |
| 2008/0286980 A1 * | 11/2008 | Ishimaru | 438/716 |
| 2009/0074984 A1 * | 3/2009 | Shimizu et al. | 427/569 |
| 2009/0151632 A1 * | 6/2009 | Okuda et al. | 118/666 |
| 2009/0255468 A1 * | 10/2009 | Yamamoto et al. | 118/723 E |
| 2009/0324826 A1 * | 12/2009 | Kato et al. | 427/255.28 |
| 2009/0324828 A1 * | 12/2009 | Kato et al. | 427/255.28 |
| 2010/0050942 A1 * | 3/2010 | Kato et al. | 118/730 |
| 2010/0050943 A1 * | 3/2010 | Kato et al. | 118/730 |
| 2010/0050944 A1 * | 3/2010 | Kato et al. | 118/730 |
| 2010/0055297 A1 * | 3/2010 | Kato et al. | 427/8 |
| 2010/0055312 A1 * | 3/2010 | Kato et al. | 427/255.26 |
| 2010/0055314 A1 * | 3/2010 | Kato et al. | 427/255.28 |
| 2010/0055315 A1 * | 3/2010 | Honma | 427/255.28 |
| 2010/0055316 A1 * | 3/2010 | Honma | 427/255.28 |
| 2010/0055317 A1 * | 3/2010 | Kato et al. | 427/255.28 |
| 2010/0055319 A1 * | 3/2010 | Kato et al. | 427/255.28 |
| 2010/0055320 A1 * | 3/2010 | Honma | 427/255.28 |
| 2010/0055351 A1 * | 3/2010 | Kato et al. | 427/595 |
| 2010/0116210 A1 * | 5/2010 | Kato et al. | 118/730 |
| 2010/0122710 A1 * | 5/2010 | Kato et al. | 134/1 |
| 2010/0124610 A1 * | 5/2010 | Aikawa et al. | 427/255.28 |
| 2010/0130009 A1 * | 5/2010 | Ishimaru | 438/680 |
| 2010/0132614 A1 * | 6/2010 | Kato et al. | 118/723 R |
| 2010/0132615 A1 * | 6/2010 | Kato et al. | 118/725 |
| 2010/0136795 A1 * | 6/2010 | Honma | 438/758 |
| 2010/0151131 A1 * | 6/2010 | Obara et al. | 427/255.28 |
| 2010/0227046 A1 * | 9/2010 | Kato et al. | 427/10 |
| 2010/0227059 A1 * | 9/2010 | Kato et al. | 427/255.28 |
| 2010/0229797 A1 * | 9/2010 | Kato et al. | 118/730 |
| 2010/0260935 A1 * | 10/2010 | Kato et al. | 427/255.28 |
| 2010/0260936 A1 * | 10/2010 | Kato et al. | 427/255.28 |
| 2010/0264117 A1 * | 10/2010 | Ohmi et al. | 216/67 |
| 2010/0291319 A1 * | 11/2010 | Yamashita et al. | 427/575 |
| 2011/0100489 A1 * | 5/2011 | Orito et al. | 137/560 |
| 2011/0126985 A1 * | 6/2011 | Ohizumi et al. | 156/345.55 |
| 2011/0139074 A1 * | 6/2011 | Kato et al. | 118/719 |
| 2011/0151122 A1 * | 6/2011 | Kato et al. | 427/255.23 |
| 2011/0155056 A1 * | 6/2011 | Kato et al. | 118/719 |
| 2011/0159187 A1 * | 6/2011 | Kato et al. | 427/255.26 |
| 2011/0159702 A1 * | 6/2011 | Ohizumi et al. | 438/778 |
| 2012/0075460 A1 * | 3/2012 | Aikawa et al. | 348/87 |
| 2012/0094011 A1 * | 4/2012 | Hishiya et al. | 427/8 |

(56) References Cited

U.S. PATENT DOCUMENTS

FOREIGN PATENT DOCUMENTS

| | | | | |
|---|---|---|---|---|
| JP | 2007-247066 | | | 9/2007 |
| JP | 2010056477 | A | * | 3/2010 |
| JP | 2010059495 | A | * | 3/2010 |
| JP | 2010059496 | A | * | 3/2010 |
| JP | 2010059498 | A | * | 3/2010 |
| JP | 2010059499 | A | * | 3/2010 |
| JP | 2010062370 | A | * | 3/2010 |
| JP | 2010062371 | A | * | 3/2010 |
| JP | 2010080924 | A | * | 4/2010 |
| JP | 2010087467 | A | * | 4/2010 |
| JP | 2010135420 | A | * | 6/2010 |
| JP | 2010153805 | A | * | 7/2010 |
| JP | 2010206025 | A | * | 9/2010 |
| JP | 2010212627 | A | * | 9/2010 |
| JP | 2010219125 | A | * | 9/2010 |
| JP | 2010239102 | A | * | 10/2010 |
| JP | 2010245448 | A | * | 10/2010 |
| JP | 2010263245 | A | * | 11/2010 |
| JP | 2011103495 | A | * | 5/2011 |
| JP | 2011103496 | A | * | 5/2011 |
| JP | 2011119408 | A | * | 6/2011 |
| JP | 2011124384 | A | * | 6/2011 |
| JP | 2011134996 | A | * | 7/2011 |
| JP | 2011135003 | A | * | 7/2011 |

* cited by examiner

FIG.11

P:1.07kPa(8Torr)

| N₂ GAS FLOW RATE Fb (slm) | PRESSURE AT VACUUM CHAMBER SIDE (FIRST PRESSURE MEASUREMENT VALUE P1) (kPa (Torr)) | PRESSURE AT VACUUM PUMP SIDE (SECOND PRESSURE MEASUREMENT VALUE P2) (kPa (Torr)) | ΔP (P1-P2) (kPa(Torr)) | OPENING DEGREE V (%) OF BUTTERFLY VALVE |
|---|---|---|---|---|
| 5 | 1.07(7.99) | 1.06(7.96) | 0.0053(0.04) | |
| 10 | 1.07(7.99) | 1.05(7.89) | 0.013(0.10) | |
| 15 | 1.07(8.00) | 1.04(7.80) | 0.27(0.20) | |
| 20 | 1.07(7.99) | 1.02(7.66) | 0.044(0.33) | |
| 25 | 1.07(7.99) | 1.00(7.50) | 0.065(0.49) | |
| 30 | 1.07(8.00) | 0.98(7.32) | 0.091(0.68) | 22.3 |
| 35 | 1.07(7.99) | 0.94(7.07) | 0.12(0.93) | |
| 40 | 1.07(7.99) | 0.90(6.77) | 0.16(1.22) | 26.8 |
| 45 | 1.07(7.99) | 0.85(6.40) | 0.21(1.59) | |
| 50 | 1.07(7.99) | 0.79(5.91) | 0.28(2.08) | 30.0 |
| 55 | 1.07(7.99) | 0.68(5.12) | 0.38(2.88) | |
| 60 | 1.07(7.99) | | | 32.7 |

86

SUBSTRATE PROCESS APPARATUS, SUBSTRATE PROCESS METHOD, AND COMPUTER READABLE STORAGE MEDIUM

CROSS-REFERENCE TO RELATED APPLICATION

This application claims the benefit of priority of Japanese Patent Application No. 2009-253321 filed on Nov. 4, 2009, with the Japanese Patent Office, the entire contents of which are hereby incorporated by reference.

BACKGROUND OF THE INVENTION

1. Field of the Invention

The present invention relates to a substrate process apparatus and substrate process method that process a substrate under vacuum using a process gas, and a storage medium that stores a computer program that causes the substrate process apparatus to perform the substrate process method.

2. Description of the Related Art

In a semiconductor device fabrication process, when vacuum processes such as film deposition, etching, or the like are performed with respect to substrates such as a semiconductor wafer (referred to as a wafer, hereinafter) in a vacuum chamber, the vacuum chamber is evacuated to reduced pressures through plural evacuation lines. In such a case, vacuum pumps are connected to the corresponding evacuation lines via corresponding pressure control valves such as a butterfly valve provided in the corresponding evacuation lines between the vacuum chamber and the corresponding vacuum pump, thereby controlling flow rates through corresponding evacuation lines.

As an example of a substrate process apparatus with plural evacuation lines thereby to evacuate the vacuum chamber, a so-called mini-batch type film deposition apparatus has been known. Such a film deposition apparatus is provided in the vacuum chamber with a wafer susceptor on which plural wafers are placed along a circumferential direction of the vacuum chamber and plural gas supplying portions. When the wafer susceptor is rotated while deposition gases are supplied to the wafer susceptor, a film is deposited on the wafers. This type film deposition apparatus is preferably applied to a film deposition method called, for example, an Atomic Layer Deposition (ALD) method and a Molecular Layer Deposition (MLD) method, where a first reaction gas and a second reaction gas are alternatively supplied to the wafers, thereby depositing a film in a layer-by-layer manner. Film deposition apparatuses suitable to such a film deposition method are specifically disclosed in, for example, Patent Documents 1 through 4 listed below. In general, process areas are partitioned in a vacuum chamber so that plural reaction gases are not intermixed with each other above the plural wafers, in such film deposition apparatuses. In addition, the plural evacuation lines are provided so that the plural reaction gases and their decomposition products may be evacuated through the corresponding evacuation lines. With this, the reaction gases are not intermixed with each other, so that particles are not produced. In addition, gas flows may be stabilized in the vacuum chamber, so that film deposition having excellent across the wafer and wafer-to-wafer uniformities is realized.

Incidentally, when the reaction gases are evacuated through the plural evacuation lines from the vacuum chamber, it is very difficult to directly measure flow rates of gases flowing through the corresponding evacuation lines, partly because an appropriate instrument capable of measuring the flow rates is not available. Because of this situation, pressure gauges are provided in the corresponding evacuation lines, so that the pressure control valves are adjusted so that pressure readings of the pressure gauges become the same in the evacuation lines.

However, even when the pressures in the evacuation lines are the same, the reaction gases may be intermixed. For example, if one of the vacuum pumps comes to have reduced performance for some reason, the pressure gauges of the corresponding evacuation lines may provide the same reading, while the flow rate is reduced in the evacuation line concerned. In addition, when deposits gradually grow on an inner surface of one of the evacuation lines, the flow rate of gas to be evacuated through the evacuation line is changed with time, which may change gas flow in the vacuum chamber, thereby adversely affecting uniformity of the process. However, such change cannot be monitored by the pressure gauge.

Namely, measuring the pressures in the evacuation lines cannot serve as an appropriate measure to comprehend reaction gas flows in the vacuum chamber. Therefore, the process gases may be intermixed or the gas flow pattern in the vacuum chamber may be degraded, which results in degraded across-wafer or wafer-to-wafer uniformity of the process. In addition, when one of the plural reaction gases is supplied at an extremely large flow rate, compared to the other reaction gases, the process gases are more likely to be intermixed.

In addition to the film deposition apparatus, there is an etching apparatus having plural evacuation lines connected to one vacuum chamber, where a large Liquid Crystal Display (LCD) substrate or a Flat Panel Display (FPD) substrate having a side length of several meters is processed, for example. In this apparatus, the plural evacuation lines are connected to corresponding evacuation openings formed at a bottom of the vacuum chamber along a susceptor on which the substrate is placed. When the vacuum chamber is not uniformly evacuated through the plural evacuation lines, uniform etching is no longer performed.

The Patent Documents 1 through 4 fail to disclose a technology that is capable of solving such problems.

Patent Document 1: U.S. Pat. No. 7,153,542 (FIGS. 6A, 6B).
Patent Document 2: Japanese Patent Publication No. 3,144,664 (FIGS. 1, 2, claim 1)
Patent Document 3: U.S. Pat. No. 6,869,641 (FIG. 1).
Patent Document 4: Japanese Patent Application Laid-Open Publication 2007-247066.

SUMMARY OF THE INVENTION

The present invention has been made in view of the above, and provides a substrate process apparatus and a substrate process method that are capable of adjusting flow rates of gases to be evacuated through corresponding evacuation passages provided in a vacuum chamber of the substrate process apparatus when substrates are processed under vacuum, and a storage medium storing a computer program for causing the substrate process apparatus to perform the substrate process method.

A first aspect of the present invention provides a substrate process apparatus that performs a process with respect to a substrate under vacuum by supplying a process gas from a process gas supplying portion to the substrate placed on a susceptor in a vacuum chamber. The substrate process apparatus includes first and second evacuation passages through which the vacuum chamber is evacuated; a first pressure adjustment valve provided in the first evacuation passage; a second pressure adjustment valve provided in the second evacuation passage; a conductance adjustment portion provided in a primary side of the second pressure adjustment valve in the second evacuation passage in order to adjust conductance of the second evacuation passage; a first pressure measurement instrument for measuring a pressure in the vacuum chamber; a differential pressure measurement portion that measures a differential pressure between the primary side and the secondary side of the conductance adjustment portion; a storage portion that stores data prescribing a relationship of the pressure in the vacuum chamber, an adjustment value of the conductance adjustment portion, a flow rate of gas to be evacuated through the second evacuation passage, and the differential pressure; and a control portion that reads out the pressure in the vacuum chamber, the adjustment value of the conductance adjustment portion, and the differential pressure which correspond to a set value of the flow rate of gas to be evacuated through the second evacuation passage from the data stored in the storage portion, and outputs instruction signals to the first pressure adjustment portion in order to adjust the pressure in the vacuum pressure to be the pressure read out from the data, to the conductance adjustment portion in order to adjust conductance in the second evacuation passage to be the adjustment value read out from the data, and to the second pressure adjustment valve in order to adjust a differential pressure across the conductance adjustment portion to be the differential value read-out from the data.

It is preferable that the conductance adjustment portion is a butterfly valve, and the adjustment value of the conductance is an opening degree of the butterfly valve.

The process is preferably a film deposition process performed by carrying out a cycle of alternately supplying at least two kinds of reaction gases that react with each other to the substrate to produce a layer of a reaction product, thereby forming a film on the substrate, and the substrate process apparatus further includes a first reaction gas supplying portion and a second reaction gas supplying portion that are arranged away from each other in a circumferential direction of the vacuum chamber, and supply a first reaction gas and a second reaction gas to the substrate on the susceptor, respectively; a separation area that is arranged between a first process area where the first reaction gas is supplied and a second process area where the second reaction gas is supplied, and supplies separation gas from a separation gas supplying portion, thereby separating atmospheres of the first process area and the second process area, a rotation mechanism that rotates the susceptor and a combination of the first reaction gas supplying portion, the second reaction gas supplying portion, and the separation area in relation to each other, so that the substrate can be positioned in the first process area, the separation area, and the second process area in this order. The first evacuation passage is provided so that the first reaction gas and part of the separation gas are evacuated through the first evacuation passage, and the second evacuation passage is provided so that the second reaction gas and remaining part of the separation gas are evacuated through the second evacuation passage.

The data in the storage portion are obtained before the process is performed with respect to the substrate, by the steps of (a) closing the first pressure adjustment valve and opening the second pressure adjustment valve, (b) supplying a flow rate control gas to the vacuum chamber, adjusting the adjustment value of the conductance adjustment portion so that the pressure in the vacuum chamber becomes substantially equal to a predetermined pressure, and obtaining the adjustment value of the conductance adjustment portion and the differential pressure, and (c) repeating the steps (a) and (b) for plural combinations of a flow rate of the flow rate adjustment gas and the pressure in the vacuum chamber.

A second aspect of the present invention provides a substrate process method that includes the steps of: placing a substrate on a susceptor in a vacuum chamber and supplying a process gas to the substrate; evacuating the vacuum chamber through a first evacuation passage provided with a first pressure adjustment valve and a second evacuation passages provided with a second pressure adjustment valve; reading out data from a storage portion; adjusting the first pressure adjustment valve so that the pressure in the vacuum chamber becomes substantially equal to the pressure value stored in the data, and adjusting a conductance adjustment portion provided in a primary side of the second pressure adjustment portion in the second evacuation passage so that the adjustment value of the conductance adjustment portion becomes substantially equal to the adjustment value stored in the data; and adjusting the second pressure adjustment valve so that a differential pressure between a primary side and a secondary side of the conductance adjustment portion becomes substantially equal to the differential pressure stored in the data. The step of reading out data reads out the pressure in the vacuum pressure, the adjustment value of the conductance adjustment portion, and the differential pressure that correspond to a set valve of a flow rate of gas to be evacuated through the second evacuation passage.

The process is preferably a film deposition process performed by carrying out a cycle of alternately supplying at least two kinds of reaction gases that react with each other to the substrate to produce a layer of a reaction product, thereby forming a film on the substrate, wherein a first reaction gas and a second reaction gas are supplied from a first reaction gas supplying portion and a second reaction gas supplying portion that are arranged away from each other in a circumferential direction of the vacuum chamber are supplied to the substrate on the susceptor, respectively in the step of supplying the process gas; wherein the substrate process method further includes steps of supplying a separation gas from a separation area that is arranged between a first process area where the first reaction gas is supplied and a second process area where the second reaction gas is supplied in the circumferential direction, in order to separate atmospheres of the first process area and the second process area; and rotating the susceptor and a combination of the first reaction gas supplying portion, the second reaction gas supplying portion, and the separation area in relation to each other, so that the substrate can be positioned in the first process area, the separation area, and the second process area in this order, and wherein the first reaction gas and part of the separation gas are evacuated through a first evacuation passage, and the second reaction gas and remaining part of the separation gas are evacuated through the second evacuation passage in the step of evacuating.

A third aspect of the present invention provides a storage medium storing a computer program to be used in a substrate process apparatus that performs a process with respect to a substrate under vacuum by supplying a process gas from a process gas supplying portion to the substrate placed on a susceptor in a vacuum chamber, the program includes a group of steps causing the substrate process apparatus to perform the substrate process apparatus of the second aspect.

BRIEF DESCRIPTION OF THE DRAWINGS

FIG. 11 illustrates an example of the table;

DETAILED DESCRIPTION OF THE PREFERRED EMBODIMENT

In an embodiment of the present invention, when a vacuum chamber is evacuated through a first evacuation passage and a second evacuation passage, a pressure in the vacuum chamber is adjusted by adjusting a first pressure adjustment valve provided in the first evacuation passage; a conductance adjustment portion provided in the second evacuation passage is adjusted in order to realize a predetermined adjustment value; and a differential pressure across a primary (upstream) side and a secondary (downstream) side of the conductance adjustment portion is adjusted by adjusting a second pressure adjustment valve. Such adjustments are performed using data prescribing a relationship of the pressure in the vacuum chamber, an adjustment value of the conductance adjustment portion, a flow rate of gas to be evacuated through the second evacuation passage, and the differential pressure. In such a manner, a pressure adjustment is performed in the first evacuation passage, and the differential pressure adjustment is performed in the second evacuation passage. Because flow rates of gases to be supplied to the vacuum chamber are known in accordance with process conditions of a process to be performed, flow rates of gases to be evacuated through the first and the second evacuation passages can be adjusted in an embodiment according to the present invention.

First Embodiment

Figure 1:
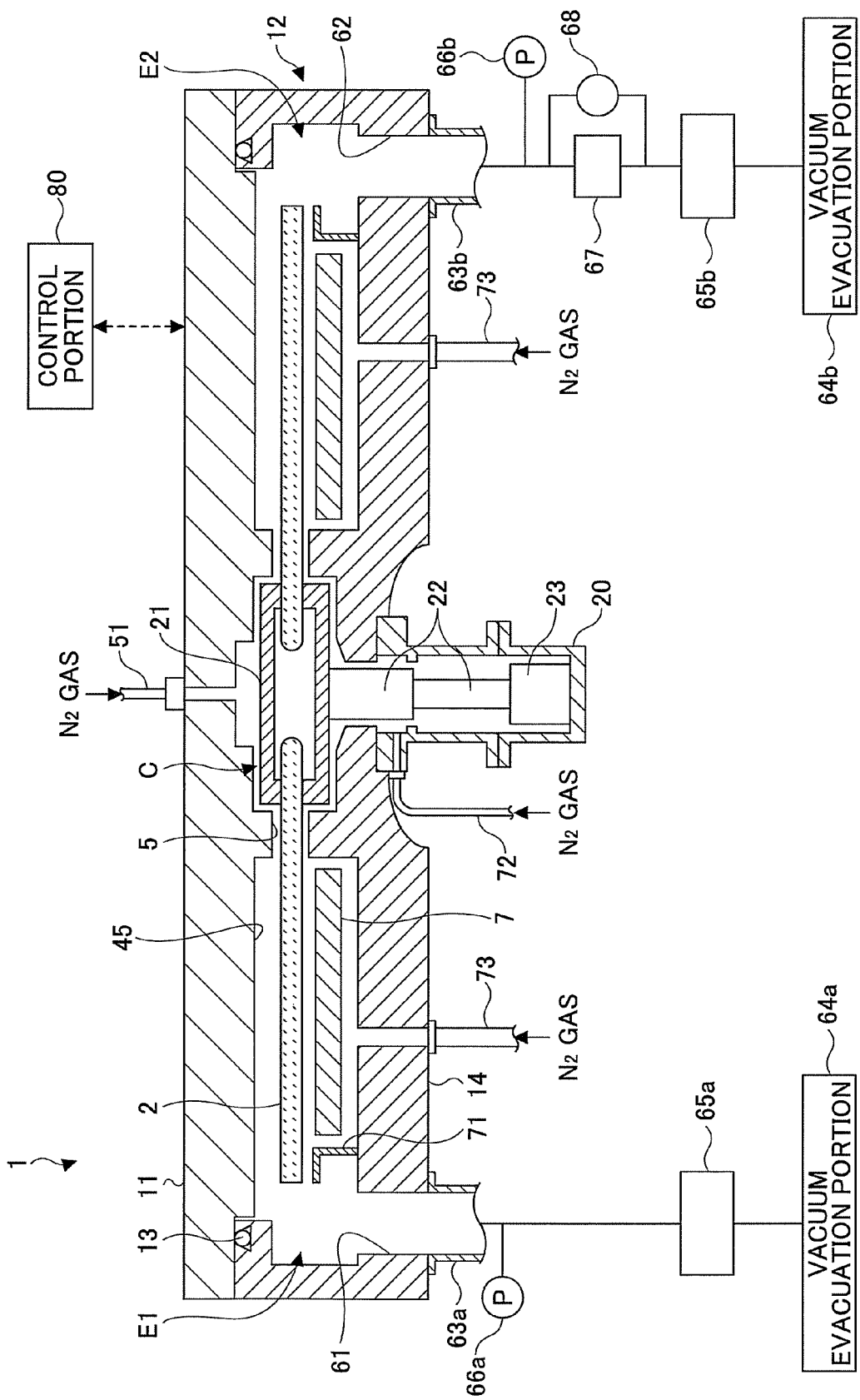
FIG. 1 is a cross-sectional view of a substrate process apparatus according to an embodiment of the present invention.

As shown in FIG. 1 (a cross-sectional view taken along I-I' line in FIG. 3), a film deposition apparatus according to a first embodiment has a vacuum chamber 1 substantially having a top-view shape of a circle, and a turntable 2 that is located inside the chamber 1 and has a rotation center at a center of the vacuum chamber 1. The vacuum chamber 1 is made so that a ceiling plate 11 can be separated from a chamber body 12. The ceiling plate 11 is pressed onto the chamber body 12 via a sealing member such as an O ring 13 so that the vacuum chamber 1 is hermetically sealed, when the vacuum chamber 1 is evacuated to reduced pressures. On the other hand, the ceiling plate 11 can be raised by a driving mechanism (not shown) when the ceiling plate 11 has to be removed from the chamber body 12.

The turntable 2 is fixed onto a cylindrically shaped core portion 21. The core portion 21 is fixed on a top end of a rotational shaft 22 that extends in a vertical direction. The rotational shaft 22 penetrates a bottom portion 14 of the chamber body 12 and is fixed at the lower end to a driving mechanism 23 that can rotate the rotational shaft 22 and thus the turntable 2 in a clockwise direction when seen from above, in this embodiment. The rotational shaft 22 and the driving mechanism 23 are housed in a case body 20 having a shape of a cylinder with a bottom. The case body 20 is hermetically fixed to a bottom surface of the bottom portion 14 via a flanged pipe portion, which isolates an inner environment of the case body 20 from an outer environment.

Figure 2:
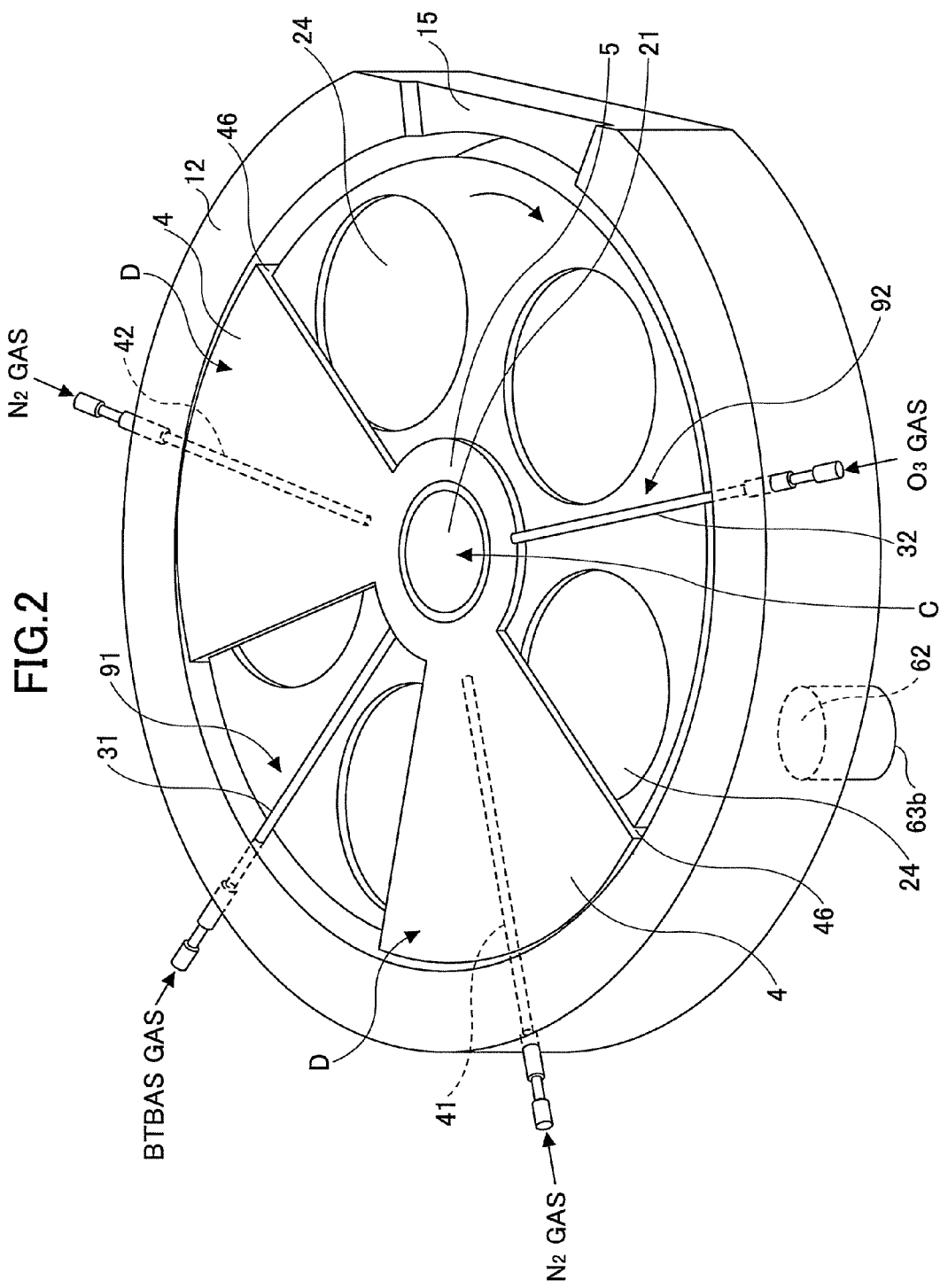
FIG. 2 is a perspective view illustrating an inner configuration of the substrate process apparatus of FIG. 1.
Figure 3:
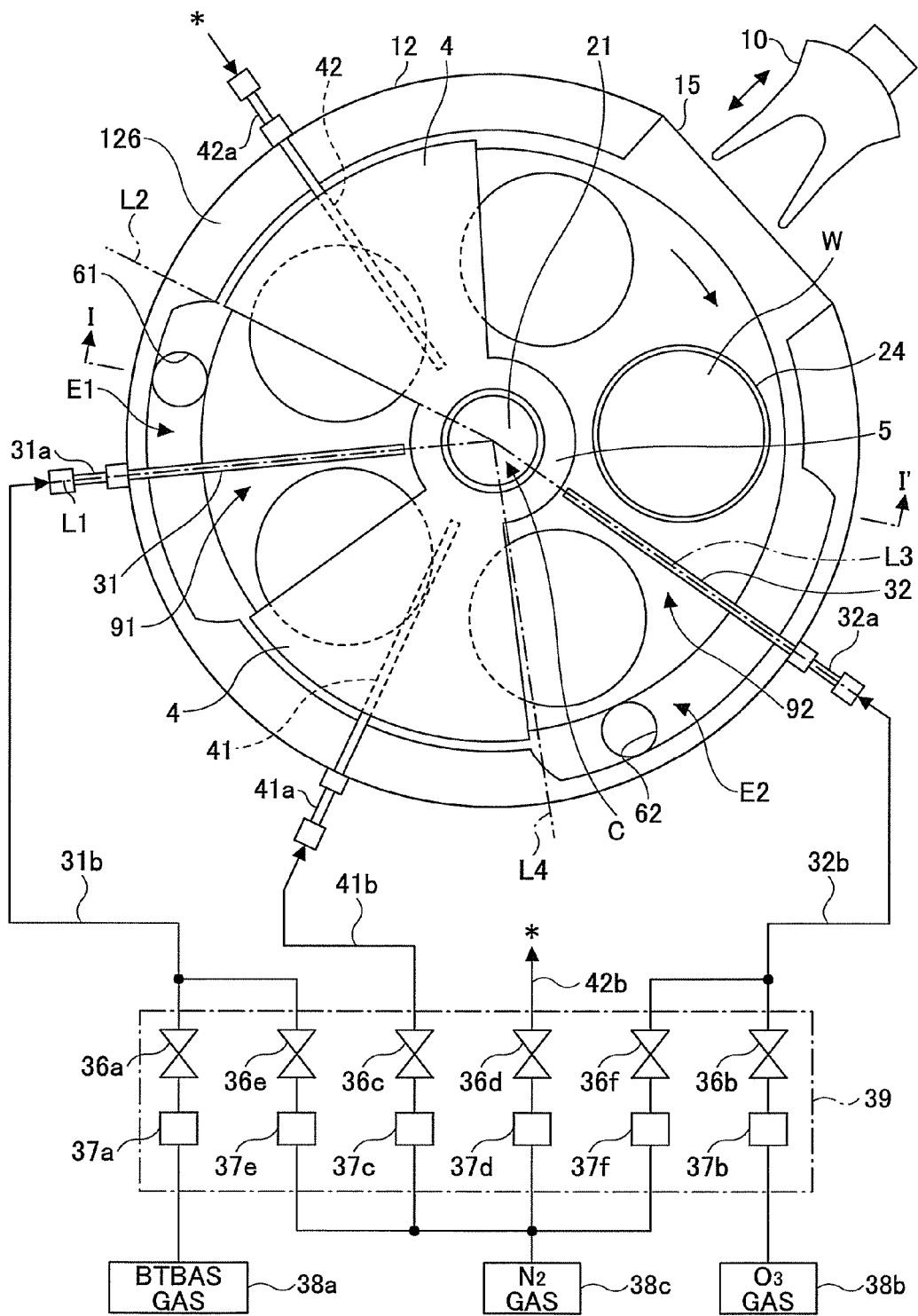
FIG. 3 is a plan view of the substrate process apparatus of FIG. 1.
Figure 4:
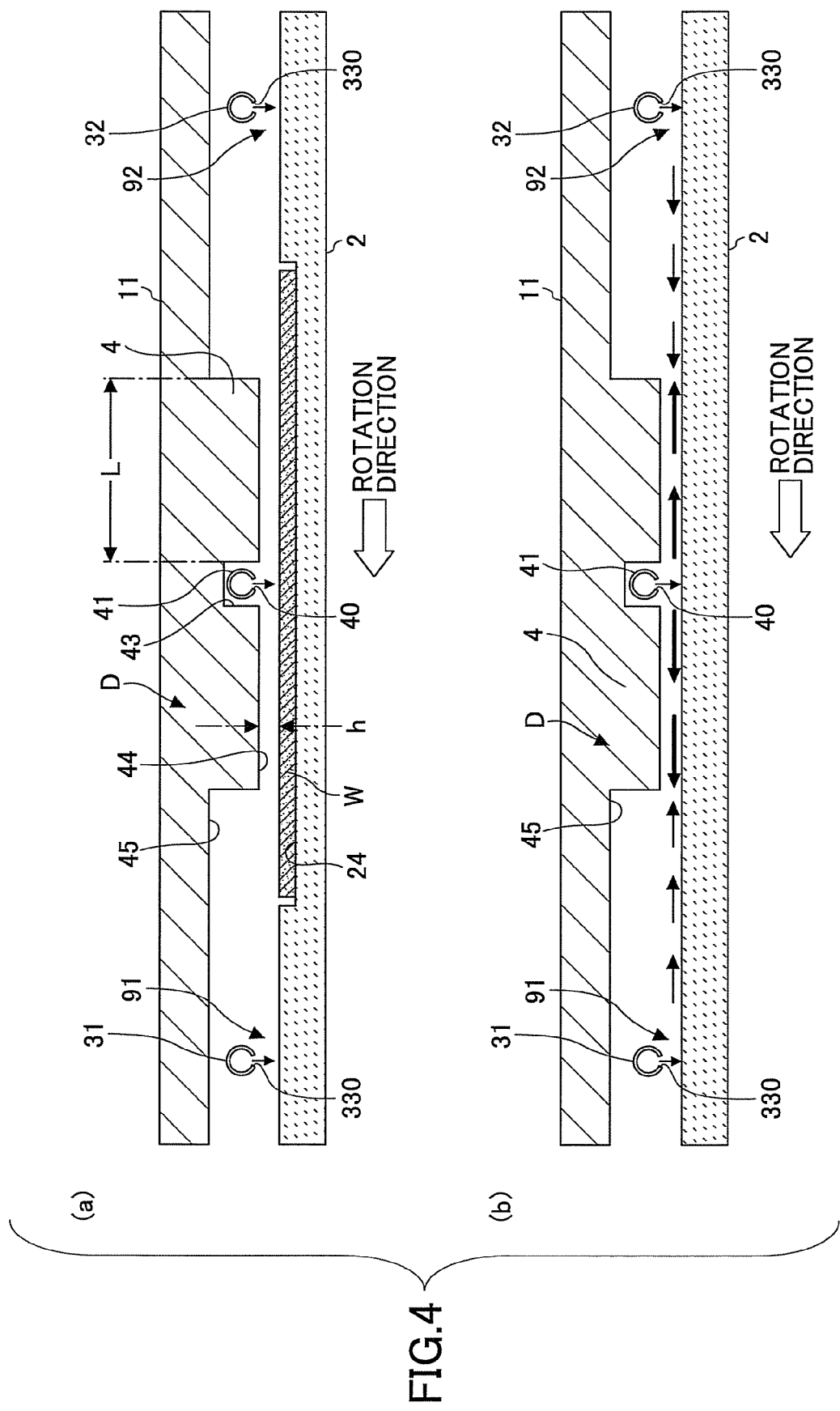
FIG. 4 is cross-sectional view illustrating a separation area and a process area in the substrate process apparatus of FIG. 1.

As shown in FIGS. 2 and 3, plural (five in the illustrated example) circular concave portions 24, each of which receives a wafer W, are formed in a top surface of the turntable 2, although only one wafer W is illustrated in FIG. 3. The concave portions 24 are located along a circumferential direction (or a rotation direction) of the turntable 2. Section (a) of FIG. 4 is a cross-sectional diagram of FIG. 3, which is taken along a circle concentric to the turntable 2. As shown in Section (a) of FIG. 4, the concave portion 24 has a diameter slightly larger, for example, by 4 mm than the diameter of the wafer W and a depth equal to a thickness of the wafer W. Therefore, when the wafer W is placed in the concave portion 24, a surface of the wafer W is at the same elevation of a surface of an area of the turntable 2, the area excluding the concave portions 24. If there is a relatively large step between the area and the wafer W, gas flow turbulence is caused by the step, which may affect thickness uniformity across the wafer W. This is why the two surfaces are at the same elevation. While "the same elevation" may mean here that a height difference is less than or equal to about 5 mm, the difference has to be as close to zero as possible to the extent allowed by machining accuracy. In the bottom of the concave portion 24 there are formed three through holes (not shown) through which three corresponding elevation pins (see FIG. 8) are raised/lowered. The elevation pins support a back surface of the wafer W and raises/lowers the wafer W.

The concave portions 24 serve as wafer receiving areas provided to position the wafers W so that the wafers W are not thrown outwardly by centrifugal force caused by rotation of the turntable 2. However, the wafer W receiving areas are not limited to the concave portions 24, but may be realized by guide members that are located at predetermined angular intervals on the turntable 2 to hold the edges of the wafers W. For example, the wafer W receiving areas may be realized by electrostatic chucks. In this case, an area where the wafer W is fixed by the electrostatic chuck serves as the wafer receiving area.

Referring to FIGS. 2 and 3, the vacuum chamber 1 includes a first reaction gas nozzle 31, a second reaction gas nozzle 32, and separation gas nozzles 41, 42 above the turntable 2, all of which extend in radial directions and at predetermined angular intervals. With this configuration, the concave portions 24 can move through and below the nozzles 31, 32, 41, and 42. In the illustrated example, the second reaction gas nozzle 32, the separation gas nozzle 41, the first reaction gas nozzle 31, and the separation gas nozzle 42 are arranged clockwise in this order from a transport opening 15 described later. These gas nozzles 31, 32, 41, and 42 penetrate the circumferential wall portion of the chamber body 12 and are supported by attaching their base ends, which are gas inlet ports 31a, 32a, 41a, 42a, respectively, on the outer circumference of the wall portion.

Although the gas nozzles 31, 32, 41, 42 are introduced into the vacuum chamber 1 from the circumferential wall portion of the vacuum chamber 1 in the illustrated example, these nozzles 31, 32, 41, 42 may be introduced from a ring-shaped protrusion portion 5 (described later). In this case, an L-shaped conduit may be provided in order to be open on the outer circumferential surface of the protrusion portion 5 and on the outer top surface of the ceiling plate 11. With such an L-shaped conduit, the nozzle 31 (32, 41, 42) can be connected to one opening of the L-shaped conduit inside the chamber 1 and the gas inlet port 31a (32a, 41a, 42a) can be connected to the other opening of the L-shaped conduit outside the chamber 1.

As shown in FIG. 3, the reaction gas nozzle 31 is connected to a first gas supplying source 38a for bis (tertiary-butylamino) silane (BTBAS), which is a first source gas, via a gas supplying pipe 31b provided with a valve 36a and a flow rate control portion 37a, and the reaction gas nozzle 32 is connected to a second gas supplying source 38b for $O_3$ (ozone) gas, which is a second source gas, via a second gas supplying pipe 32b provided with a valve 36b and a gas flow rate control portion 37b. In addition, the separation gas nozzle 41 is connected to gas supplying source 38c for $N_2$ (nitrogen) gas, which is a separation gas, via a gas supplying pipe 41b provided with a valve 36c and a gas flow rate control portion 37c. The separation gas nozzle 42 is connected to gas supplying source 38c for $N_2$ (nitrogen) gas via a gas supplying pipe 42b provided with a valve 36d and a gas flow rate control portion 37d.

The gas supplying pipe 31b between the reaction gas nozzle 31 and the valve 36a is connected also to the gas supplying source 38c via a valve 36e and a gas flow rate control portion 37e, and the gas supplying pipe 32b between the reaction gas nozzle 32 and the valve 36b is connected also to the gas supplying source 38c via a valve 36f and a gas flow rate control portion 37f. These valves 36a through 36f and the gas flow rate control portions 37a through 37f constitute a gas supplying system 39.

The reaction gas nozzles 31, 32 have plural ejection holes 330 (FIG. 4) to eject the corresponding source gases downward. The plural ejection holes 330 are arranged in longitudinal directions of the reaction gas nozzles 31, 32 at predetermined intervals. The ejection holes 33 have an inner diameter of about 0.5 mm, and are arranged at intervals of about 10 mm in this embodiment. The reaction gas nozzles 31, 32 serve as a first reaction gas supplying portion and a second reaction gas supplying portion, respectively, in this embodiment. In addition, an area below the reaction gas nozzle 31 corresponds to a first process area 91 in which the BTBAS gas is adsorbed on the wafer W, and an area below the reaction gas nozzle 32 corresponds to a second process area 92 in which the $O_3$ gas is adsorbed on the wafer W.

The separation gas nozzles 41, 42 are provided to configure corresponding separation areas that separate the first process area 91 and the second process area 92. In each of the separation areas D, there is provided a convex portion 4 on the ceiling plate 11, as shown in FIGS. 2 through 4. The convex portion 4 has a top view shape of a truncated sector whose inner arc is coupled with the circumference of the protrusion portion 5 and whose outer arc lies near and along the inner circumferential wall of the chamber body 12. In addition, the convex portion 4 has a groove portion 43 that extends in the radial direction so that the convex portion 4 is substantially bisected by the groove portion 43. The separation gas nozzle 41 (42) is housed in the groove portion 43. A circumferential distance between the center axis of the separation gas nozzle 41 (42) and one side of the sector-shaped convex portion 4 is substantially equal to the other circumferential distance between the center axis of the separation gas nozzle 41 (42) and the other side of the sector-shaped convex portion 4.

Incidentally, while the groove portion 43 is formed in order to bisect the convex portion 4 in this embodiment, the groove portion 42 is formed so that an upstream side of the convex portion 4 relative to the rotation direction of the turntable 2 is wider, in other embodiments.

With the above configuration, there are flat low ceiling surfaces 44 (first ceiling surfaces) on both sides of the separation gas nozzle 41 (42), and high ceiling surfaces 45 (second ceiling surfaces) outside of the corresponding low ceiling surfaces 44, as shown in FIG. 4. The convex portion 4 (ceiling surface 44) provides a separation space, which is a thin space, between the convex portion 4 and the turntable 2 in order to impede the first and the second gases from entering the thin space and from being intermixed.

Referring to Section (b) of FIG. 4, the $O_3$ gas is impeded from entering the space between the convex portion 4 and the turntable 2, the $O_3$ gas flowing toward the convex portion 4 from the reaction gas nozzle 32 along the rotation direction of the turntable 2, and the BTBAS gas is impeded from entering the space between the convex portion 4 and the turntable 2, the BTBAS gas flowing toward the convex portion 4 from the reaction gas nozzle 31 along the counter-rotation direction of the turntable 2. "The gases being impeded from entering" means that the $N_2$ gases as the separation gas ejected from the separation gas nozzle 41 diffuses between the first ceiling surfaces 44 and the upper surface of the turntable 2 and flows out to a space below the second ceiling surfaces 45, which are adjacent to the corresponding first ceiling surfaces 44 in the illustrated example, so that the gases cannot enter the separation space from the space below the second ceiling surfaces 45. "The gases cannot enter the separation space" means not only that the gas are completely prevented from entering the separation space, but that the gases cannot proceed farther toward the separation gas nozzle 41 and thus be intermixed with each other even when a fraction of the reaction gases to enter the separation space. Namely, as long as such effect is demonstrated, the separation area D is to separate the first process area 91 and the second process area 92. Incidentally, the BTBAS gas or the $O_3$ gas adsorbed on the wafer W can pass through below the convex portion 4. Therefore, the gases in "the gases being impeded from entering" mean the gases are in a gaseous phase.

When the wafer W having a diameter of about 300 mm is processed in the vacuum chamber 1 in this embodiment, the convex portion 4 has a circumferential length of, for example, about 146 mm along an inner arc that is at a distance 140 mm from the rotation center of the turntable 2, and a circumferential length of, for example, about 502 mm along an outer arc corresponding to the outermost portion of the concave portions 24 of the turntable 2 in this embodiment. In addition, a circumferential length from one side wall of the convex portion 4 through the nearest side wall of the groove portion 43 along the outer arc is about 246 mm.

In addition, a height h (see FIG. 4) of the back surface of the convex portion 4, or the ceiling surface 44, measured from the top surface of the turntable 2 (or the wafer W) is, for example, about 0.5 mm through about 10 mm, and preferably about 4 mm. In this case, the rotational speed of the turntable 2 is, for example, 1 through 500 revolutions per minute (rpm). In order to ascertain the separation function performed by the separation area D, the size of the convex portion 4 and the height h of the ceiling surface 44 from the turntable 2 may be determined depending on the pressure in the chamber 1 and the rotational speed of the turntable 2 through experimentation. Incidentally, the separation gas is $N_2$ in this embodiment but may be an inert gas such as He and Ar, or $H_2$ in other embodiments, as long as the separation gas does not affect the deposition of silicon dioxide.

The protrusion portion 5 is provided on a back surface of the ceiling plate 11 so that the inner circumference of the protrusion portion 5 faces the outer circumference of the core portion 21. The protrusion portion 5 opposes the turntable 2 at an outer area of the core portion 21. In addition, the protrusion portion 5 is formed to be continuous with the inner arc of the convex portion 4. A back surface of the protrusion portion 5 and a back surface of the convex portion 4 are positioned at the same elevation. FIGS. 2 and 3 illustrate the inner configuration of the vacuum chamber 1 that may be severed at a position below the ceiling plate 11 and above the separation gas nozzles 41, 42. Incidentally, the protrusion portion 5 and the convex portion 4 are not necessarily formed as one member, but formed separately.

Incidentally, although the separation area D is configured by forming the groove portion 43 in a sector-shaped plate to be the convex portion 4, and locating the separation gas nozzle 41 (42) in the groove portion 43 in this embodiment, two sector-shaped plates may be attached on the lower surface of the ceiling plate 11 by screws so that the two sector-shaped plates are located on both sides of the separation gas nozzle 41 (32).

Figure 5:
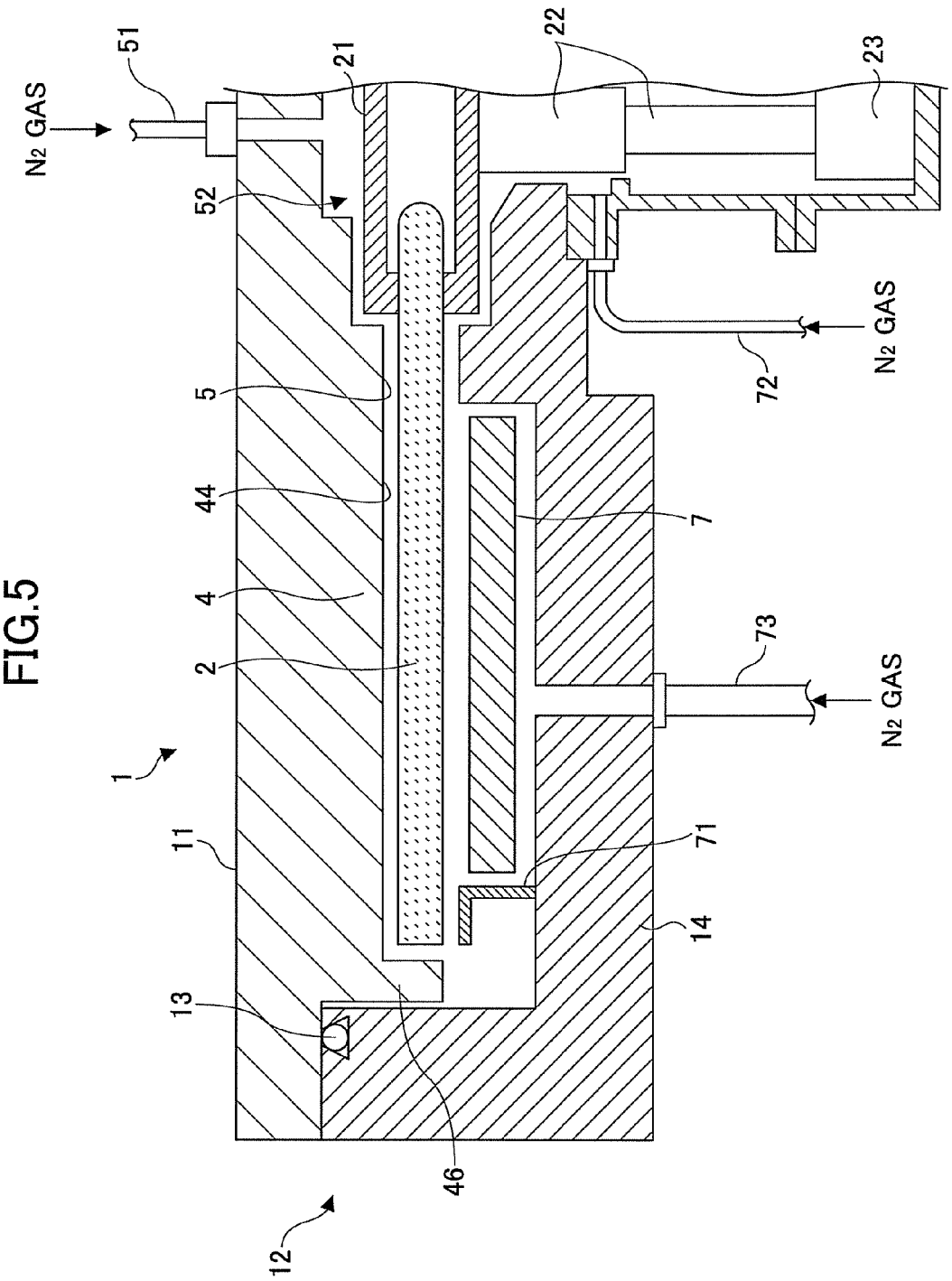
FIG. 5 is a cross-sectional view illustrating a part of the substrate process apparatus of FIG. 1.

Below the ceiling plate 11 of the vacuum chamber 1, the first ceiling surface 44 and the second surface 45 that is higher than the first ceiling surface 44 are alternatively formed along the circumferential direction of the vacuum chamber 1. FIG. 1 illustrates a cross section of the vacuum chamber, where the higher ceiling surfaces 44 are provided. FIG. 5 illustrates another cross section of the vacuum chamber 1, where the lower ceiling surfaces 44 are provided. The convex portion 4 has a bent portion 46 that bends in an L-shape at the outer circumferential edge of the convex portion 4, as shown in FIGS. 2 and 5. Because the convex portion 4 is attached on the back surface of the ceiling plate 11 that can be removed from the chamber body 12, there are slight gaps between the bent portion 46 and the turntable 2 and between the bent portion 46 and the chamber body 12. However, the bent portion 46 substantially can fill out a space between the turntable 2 and the chamber body 12, thereby impeding the first reaction gas (BTBAS) ejected from the first reaction gas nozzle 31 and the second reaction gas (ozone) ejected from the second reaction gas nozzle 32 from being intermixed through the space between the turntable 2 and the chamber body 12. The gaps between the bent portion 46 and the turntable 2 and between the bent portion 46 and the chamber body 12 may be the same as the height h of the ceiling surface 44 from the turntable 2. In the illustrated example, an inner surface of the bent portion 46 facing the outer circumferential surface of the turntable 2 serves as an inner circumferential wall of the vacuum chamber 1.

The inner circumferential wall of the chamber body 12 provides a vertical circumferential wall that comes close to an outer circumferential wall of the bent portion 46 in the separation area D, as shown in FIG. 5. On the other hand, the inner circumferential wall is dented in an area excluding the separation portions D. Namely, portions of the inner circumferential wall of the chamber body 12, the portion facing the outer circumferential surface of the turntable 2, are dented from the bottom portion 14 of the chamber body 12 through the ceiling plate 11. Here, the dented portion mainly in gaseous communication with the first process area 91 is referred to as a first evacuation area E1, and the dented portion mainly in gaseous communication with the second process area 92 is referred to as a second evacuation area E2. Below the evacuations area E1 and E2, a first evacuation port 61 and a second evacuation area E2 are formed, respectively, as shown in FIGS. 1 and 3.

As stated above, the evacuation ports 61, 62 are located in both sides of the separation area D when seen from above, in order to facilitate the separation effect of the separation area D. Specifically, the first evacuation port 61 is formed between the first process area 91 and the separation area D located downstream relative to the rotation direction of the turntable 2 in relation to the first process area 91 when seen from the rotation center of the turntable 2, and the second evacuation port 61 is formed between the second process area 92 relative to the rotation direction of the turntable 2 in relation to the second process area 92 when seen from the rotation center of the turntable 2. The reaction gases (BTBAS gas and $O_3$ gas) are evacuated mainly through the corresponding evacuation ports 61, 62. In the illustrated example, the evacuation port 61 is provided between the reaction gas nozzle 31 and an extended line along a straight edge of the convex portion 4 located downstream relative to the rotation direction of the turntable 2 in relation to the reaction gas nozzle 31, the straight edge being closer to the reaction gas nozzle 31. In addition, the evacuation port 62 is provided between the reaction gas nozzle 32 and an extended line along a straight edge of the convex portion 4 located downstream relative to the rotation direction of the turntable 2 in relation to the reaction gas nozzle 32, the straight edge being closer to the reaction gas nozzle 32. In other words, the evacuation port 61 is provided between a straight line L1 shown by a chain line in FIG. 3 that extends from the center of the turntable 2 along the reaction gas nozzle 31 and a straight line L2 shown by a two-dot chain line in FIG. 3 that extends from the center of the turntable 2 along the straight edge on the upstream side of the convex portion 4 concerned. Additionally, the evacuation port 62 is provided between a straight line L3 shown by a chain line in FIG. 3 that extends from the center of the turntable 2 along the reaction gas nozzle 32 and a straight line L4 shown by a two-dot chain line in FIG. 3 that extends from the center of the turntable 2 along the straight edge on the upstream side of the convex portion 4 concerned.

Although the two evacuation ports 61, 62 are made in the chamber body 12 in this embodiment, three evacuation ports may be provided in other embodiments. For example, an additional evacuation port may be made in an area between the second reaction gas nozzle 32 and the separation area D located upstream relative to the clockwise rotation of the turntable 2 in relation to the second reaction gas nozzle 32. In addition, a further additional evacuation port may be made in the chamber body 12. While the evacuation ports 61, 62 are located below the turntable 2 to evacuate the vacuum chamber 1 through an area between the inner circumferential wall of the chamber body 12 and the outer circumferential surface of the turntable 2 in the illustrated example, the evacuation ports may be located in the side wall of the chamber body 12. In addition, when the evacuation ports 61, 62 are provided in the side wall of the chamber body 12, the evacuation ports 61, 62 may be located higher than the turntable 2. In this case, the gases flow along the upper surface of the turntable 2 into the evacuation ports 61, 62 located higher the turntable 2. Therefore, it is advantageous in that particles in the vacuum chamber 1 are not blown upward by the gases, compared to when the evacuation ports are provided, for example, in the ceiling plate 11.

A first evacuation passage 63a extending from the first evacuation port 61 is connected to a vacuum pump 64a serving as a first evacuation portion via a first valve 65a serving as a first pressure control valve. The first valve 65a is configured to adjust an opening degree, thereby to control a gas flow rate of the gas flowing through the first evacuation passage 63a. In addition, a pressure measurement instrument 66a, which can be composed of a pressure gauge and the like, is provided in order to measure a pressure at an upstream point in relation to the first valve 65a, in the first evacuation passage 63a between the vacuum chamber 1 and the first valve 65a, The pressure is substantially equal to a pressure inside the vacuum chamber 1.

A second evacuation passage 63b extending from the second evacuation port 62 is connected to a vacuum pump 64b serving as a second evacuation portion via a second valve 65b serving as a first pressure control valve. The second valve 65b has the same configuration of the first valve 65a. In addition, a butterfly valve 67 serving as a conductance adjusting portion is provided between the second valve 65b and the vacuum chamber 1 in the second evacuation passage 63b. The butterfly valve 67 is configured so that an opening degree of the butterfly valve 67 is adjusted to control conductance of the second evacuation passage 63b, thereby controlling a flow rate of the gas flowing through the second evacuation passage 63b. With this, a differential pressure is caused between upstream and downstream portions of the butterfly valve 67 (or a primary side closer to the vacuum chamber 1 and a secondary side closer to the second valve 65b). In order to measure the differential pressure, a differential pressure gauge 68 serving as a differential pressure measurement portion is provided in the second evacuation passage 63b. In addition, in the second evacuation passage 63b between the vacuum chamber 1 and the butterfly valve 67, a pressure measurement instrument 66b, which can be composed of a pressure gauge and the like, is provided in order to measure a pressure at an upstream point in relation to the first valve 65a, the pressure being substantially equal to a pressure inside the vacuum chamber 1. In the illustrated example, the pressure measurement instruments 66a, 66b correspond to a first pressure measurement instrument. Incidentally, the first valve 65a and the second valve 65b may be referred to as a valve M1 and a valve M2, respectively.

Figure 6:
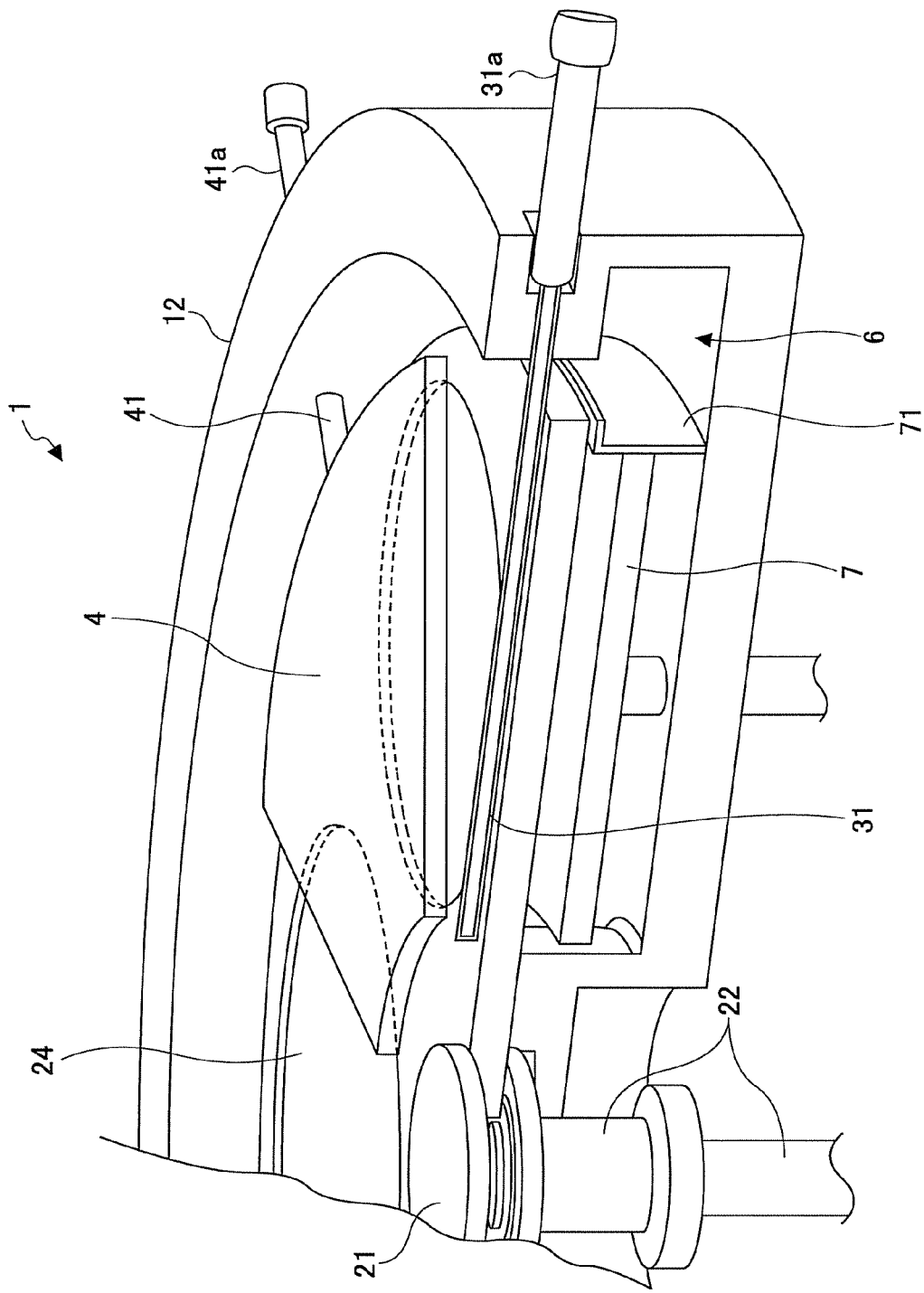
FIG. 6 is a fragmentary perspective view of the substrate process apparatus of FIG. 1.

As shown in FIGS. 1, and 6, a heater unit 7 serving as a heating portion is provided in a space between the bottom portion 14 of the chamber body 12 and the turntable 2, so that the wafers W placed on the turntable 2 are heated through the turntable 2 at a temperature determined by a process recipe. In addition, a cover member 71 is provided beneath the turntable 2 and near the outer circumference of the turntable 2 in order to surround the heater unit 7, so that the space where the heater unit 7 is located is partitioned from the outside area of the cover member 71. An upper portion of the cover member 71 is bent outward so that a slight gap is maintained between the back surface of the turntable 2 and the bent upper portion in order to impede gas from flowing inside the cover member 71.

A portion of the bottom portion 14 inner side of the space where the heater unit 7 is arranged comes close to the back surface of the turntable 2 and the core portion 21, leaving a slight gap with respect to the back surface of the turntable 2 and the core portion 21. In addition, there is a slight gap between the through hole of the bottom portion 14, through which the rotational shaft 22 goes, and the rotational shaft 22. This slight gap is in gaseous communication with the inside of the case body 20. A purge gas supplying pipe 72 is connected to the case body 20. In addition, plural purge gas supplying pipes 73 are provided at predetermined angular intervals to areas below the heater unit 7 in order to purge the space where the heater unit 7 is arranged.

Figure 7:
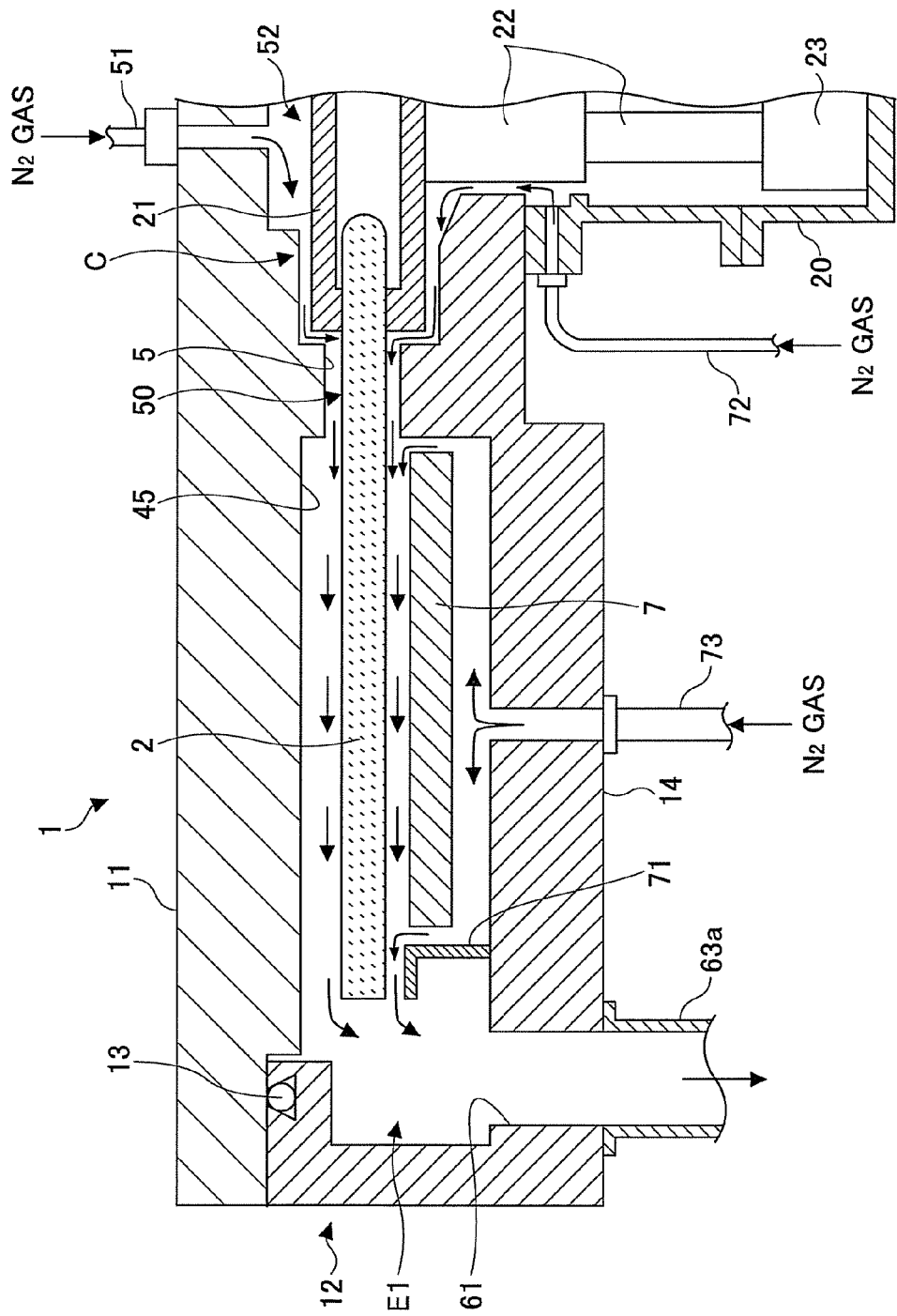
FIG. 7 is an explanatory view illustrating how a separation gas or a purge gas flows in the substrate process apparatus of FIG. 1.

As shown by arrows in FIG. 7, a space from the case body 20 through the space where the heater unit 7 is arranged can be purged with $N_2$ gas by providing the purge gas supplying pipes 72, 73. The purge gas is evacuated from the evacuation areas E1 and E2 through the gap between the cover member 71 and the turntable 2. Therefore, the BTBAS gas (or $O_3$ gas) is impeded from entering the second process area 92 (or the first process area 91) from the first process area 91 (or the second process area 92) through the area below the turntable 2. Namely, the purge gas serves as the separation gas.

In addition, a separation gas supplying pipe 51 is connected to the top center portion of the ceiling plate 11 of the vacuum chamber 1, so that $N_2$ gas is supplied as a separation gas to a space 52 between the ceiling plate 11 and the core portion 21. The separation gas supplied to the space 52 flows through the thin gap 50 between the protrusion portion 5 and the turntable 2 and then along the top surface of the turntable 2 toward the circumferential edge of the turntable 2. Because the space 52 and the gap 50 are filled with the $N_2$ gas at a relatively higher pressure than a pressure in the process areas 91, 92, the reaction gases (BTBAS, $O_3$) cannot be intermixed through the center portion of the turntable 2. In other words, the film deposition apparatus according to this embodiment is provided with a center area C that is defined by the center portion of the turntable 2 and the vacuum chamber 1 in order to isolate atmospheres of the first process area 91 and the second process area 92 and is configured to have an ejection opening that ejects the separation gas toward the top surface of the turntable 2. The ejection opening corresponds to the gap 50 between the protrusion portion 5 and the turntable 2, in the illustrated example.

Figure 8:
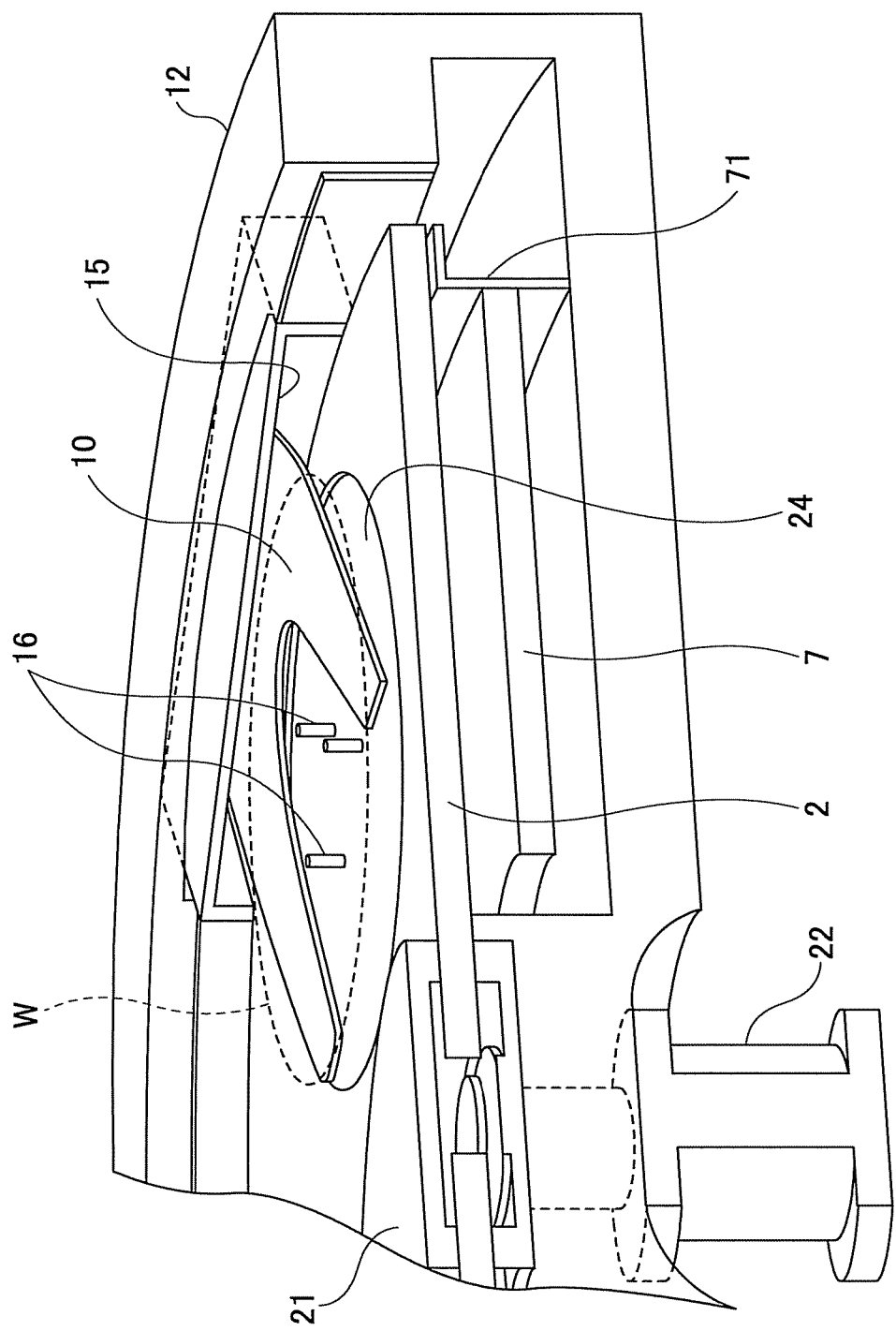
FIG. 8 is another fragmentary perspective view of the substrate process apparatus of FIG. 1.

In addition, a transfer opening 15 is formed in a side wall of the chamber body 12 as shown in FIGS. 2, 3 and 8. Through the transfer opening 15, the wafer W is transferred into or out from the vacuum chamber 1 by a transfer arm 10 (FIGS. 3 and 8) provided outside the vacuum chamber 1. The transfer opening 15 is provided with a gate valve (not shown) by which the transfer opening 15 is opened or closed. Because the wafer W is placed in or raised from the concave portion 24 of the turntable 2 that is in alignment with the transfer opening 15 by using the elevation pins 16 (FIG. 8), an elevation mechanism (not shown) that moves upward or downward the elevation pins 16 through the through holes of the concave portion 24 of the turntable 2 is provided below the concave portion 24 in alignment with the transfer opening 15.

Figure 9:
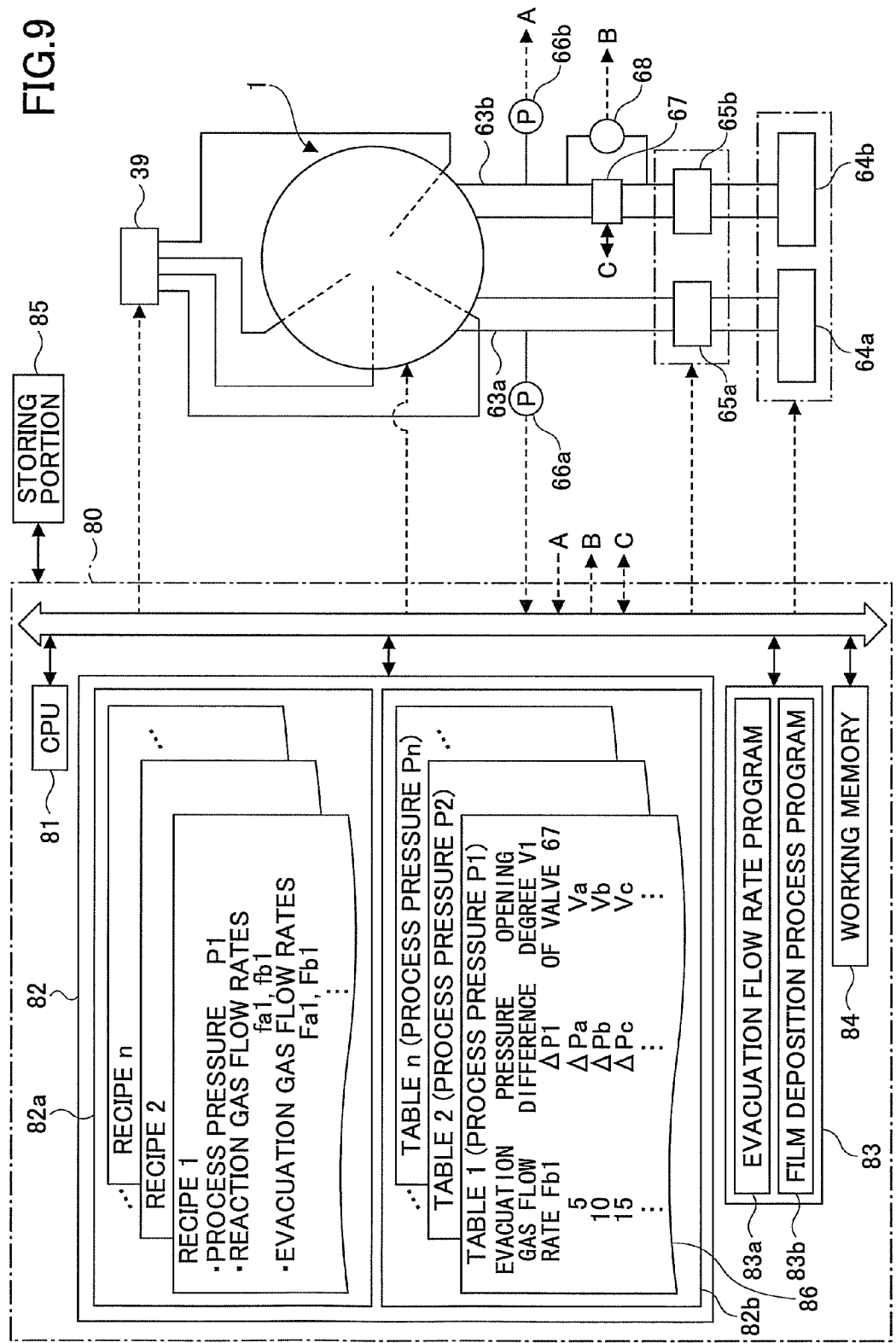
FIG. 9 schematically illustrates an example of a control portion of the substrate process apparatus of FIG. 1.

In addition, the film deposition apparatus according to this embodiment is provided with a control portion 80 composed of, for example, a computer that substantially entirely controls the components or elements of the film deposition apparatus, as shown in FIG. 9. The control portion 80 is provided with a CPU, a memory 82 as a storing portion, a process program 83, and a working memory 84. The memory 82 includes a first memory 82a that stores recipes (process conditions) for corresponding processes that are performed with respect to the wafer W, and a second memory 82b that stores a table 86 (described later). The recipes in the first memory 82a store process conditions such as a process pressure P in the vacuum chamber 1 at the time of performing a film deposition process, gas flow rates fa, fb of the reaction gases supplied from the corresponding reaction gas nozzles 31, 32 to the vacuum chamber 1, evacuation flow rates Fa, Fb of gases to be evacuated through corresponding evacuation passages 63a, 63b, and the like. The table 86 stored in the second memory 82b stores relationships among a set value of an evacuation flow rate Fb of gas to be evacuated through the second evacuation passage 63b, an adjustment value of an opening degree of the butterfly valve 67, a differential pressure ΔP measured by the differential pressure gauge 68, with respect to each of process pressure values P. Incidentally, the table 86 is simplified in FIG. 9.

The process program 83 includes an evacuation flow rate program 83a to be used to calculate the flow rates of the gases to be evacuated through corresponding ones of the first evacuation passage 63a and the second evacuation passage 63b, and a film deposition process program to be used to perform the film deposition process. The reason why the evacuation flow rate program 83a is required is explained in the following.

As stated before, when the reaction gases (e.g., BTBAS gas and $O_3$ gas) to be reacted with each other are supplied to the vacuum chamber 1, the reaction gases need to be evacuated from the corresponding evacuation ports 61, 62 in order to avoid intermixture of the reaction gases in the vacuum chamber 1. To this end, it is required to adjust the evacuation flow rates of the gases to be evacuated from the corresponding evacuation ports 61, 62, or allocate the evacuation flow rates to the corresponding evacuation ports 61, 62, depending on each flow rate of the reaction gases to be supplied from the corresponding reaction gas nozzles 31, 32 to the vacuum chamber 1. For example, when it is assumed that a flow rate of the reaction gas to be supplied from the reaction gas nozzle 31 to the vacuum chamber 1 is fa and a flow rate of the reaction gas to be supplied from the reaction gas nozzle 32 to the vacuum chamber 1 is fb, the reaction gas from the reaction gas nozzle 31 should be evacuated at the flow rate fa from the evacuation port 61 and the reaction gas from the reaction gas nozzle 32 should be evacuated at the flow rate fb from the evacuation port 62. Specifically, a mixed gas of the reaction gas from the reaction gas nozzle 31 and part of $N_2$ gas supplied to the vacuum chamber 1 is evacuated at a total flow rate Fa, which is a total of the flow rate fa of the reaction gas from the reaction gas nozzle 31 and a flow rate of the part of $N_2$ gas, from the evacuation port 62. In addition, another mixed gas of the reaction gas from the reaction gas nozzle 32 and the remaining part of $N_2$ gas supplied to the vacuum chamber 1 is evacuated at a total flow rate Fb, which is a total of the flow rate fb of the reaction gas from the reaction gas nozzle 32 and a flow rate of the remaining part of $N_2$ gas, from the evacuation port 62.

In this case, it is very difficult to directly measure the flow rates of Fa, Fb of the mixed gases flowing through the corresponding evacuation passages 63a, 63b by flow meters. Here, if the evacuation flow rates are adjusted using the pressure measurement instruments 66a, 66b, the opening degrees of the valves 65a, 65b need to be adjusted so that the measurement values from the corresponding pressure measurement instruments 66a, 66b are substantially identical, or at a predetermined ratio, depending on the flow rates fa, fb of the corresponding reaction gases. In this situation, if conductance of, for example, one of the evacuation passages 63a, 63b becomes lower than a normal value for some reasons or if evacuation performances of the vacuum pumps 64a, 64b provided in the corresponding evacuation passages 63a, 63b are different especially when the film deposition process is performed at relatively low pressures, the measurement values from the corresponding pressure measurement instruments 66a, 66b can be identical. Namely, it is very difficult to adjust the evacuation flow rates of the gases to be evacuated through the corresponding evacuation passages 63a, 63b depending on the flow rates fa, fb of the reaction gases supplied from the corresponding reaction gas nozzles 31, 32, by using only the pressure measurement instruments 66a, 66b.

Therefore, in this embodiment of the present invention, before the film deposition process is performed or when a preventive maintenance is performed, the evacuation flow rates of the gases to be evacuated through the evacuation passages 63a, 63b (more specifically, the evacuation flow rate of the gas to be evacuated through the evacuation passage 63b) are directly calculated in advance by using the program 83a. Specifically, first, the first valve 65a is closed, and the second valve 65b is open to the full. Next, the flow rate adjustment portions 37c, 37d, 37f are adjusted so that inert gas such as $N_2$ gas serving as a flow rate adjusting gas is supplied at a flow rate of Fb to the vacuum chamber 1. Then, an opening degree of the butterfly valve 67 is adjusted so that a pressure in the vacuum chamber 1 (a measurement value of the pressure measurement instrument 66b) is maintained constant at a set pressure (process pressure) P. As a result, the $N_2$ gas is evacuated at the flow rate of Fb through the second evacuation passage 63b. In this case, the opening degree (set opening degree) of the butterfly valve 67 is assumed to be V. In addition, because the second valve 65b is opened and the pressure in the vacuum chamber 1 is adjusted by the opening degree of the butterfly valve 67, the first pressure measurement value, which substantially indicates the pressure in the vacuum chamber 1, is higher than the second pressure measurement value, which corresponds to the pressure in the second evacuation passage 63b between the butterfly valve 67 and the second valve 65b. Namely, a differential pressure (set differential pressure) ΔP is caused across the butterfly valve 67 and is measured by the differential pressure gauge 68.

As stated above, when the pressure in the vacuum chamber 1 is the process pressure P, the opening degree of the butterfly valve 67 is V, and the differential pressure (the measurement value of the differential pressure gauge 68) across the butterfly valve 67 is ΔP, the flow rate of gas to be evacuated through the second evacuation passage 63b becomes substantially equal to Fb. Therefore, even when the reaction gases and the $N_2$ gas are supplied at a total flow rate of F (F=Fa+Fb) and evacuated through the evacuation passages 63a, 63b, if the pressure in the vacuum chamber 1 is maintained at the process pressure P, the opening degree of the butterfly valve 67 is maintained at V, and the differential pressure (the measurement value of the differential pressure gauge 68) across the butterfly valve 67 is maintained at ΔP, the flow rate of gas to be evacuated through the second evacuation passage 63b becomes substantially equal to Fb, and thus the flow rate of gas to be evacuated through the first evacuation passage 63a is Fa (Fa=F−Fb). Therefore, the flow rates in the corresponding evacuation passages 63a, 63b are adjusted.

Figure 10:
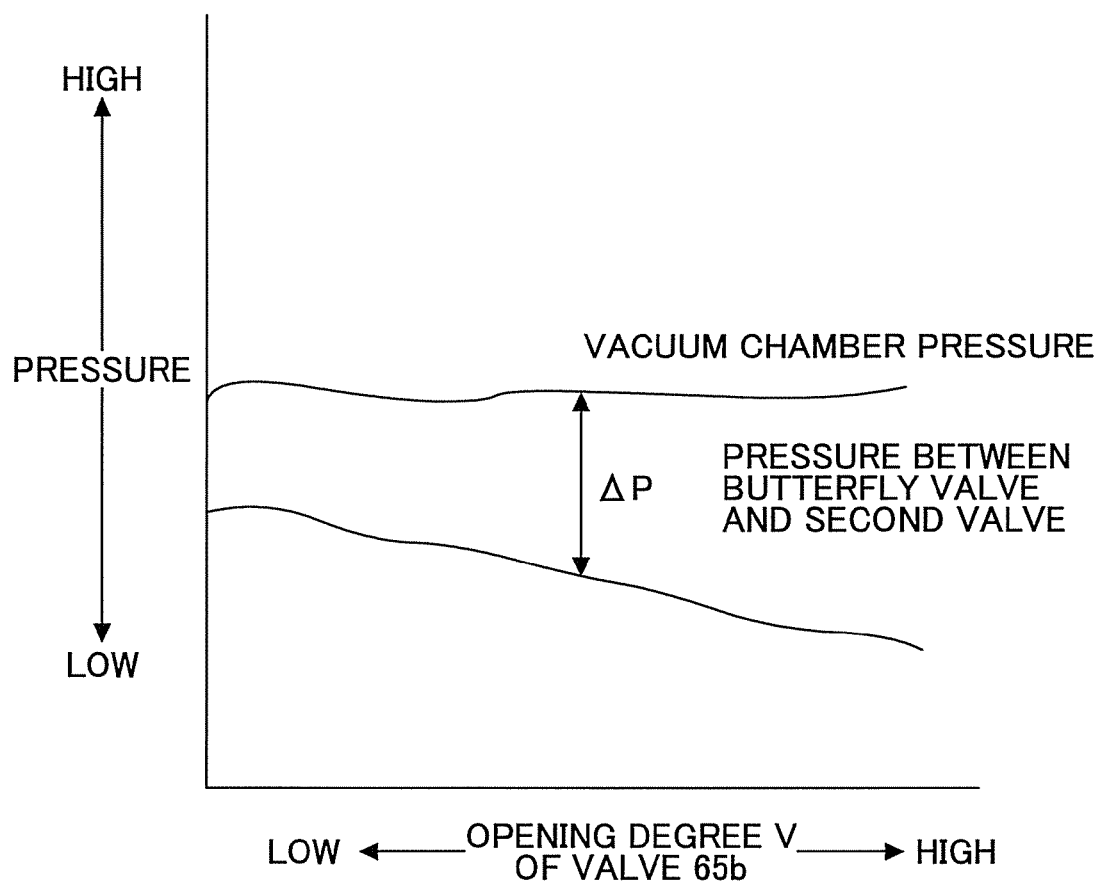
FIG. 10 schematically illustrates pressures in various portions of the substrate process apparatus when a table is generated.

Therefore, before the reaction gases and the $N_2$ gas is supplied at the flow rate F and evacuated through the two evacuation passages 63a, 63b, the opening degree of the butterfly valve 67 is set at V. Then, as shown in FIG. 10, the opening degree of the first valve 65a is adjusted so that the pressure in the vacuum chamber 1 (or the measurement value of the pressure measurement instrument 66a) is maintained at the process pressure P, and the opening degree of the second valve 65b is adjusted so that the measurement value of the differential pressure gauge 68 becomes substantially equal to the differential pressure ΔP. In such a manner, part of the mixed gas is evacuated at the flow rate Fb through the second evacuation passage 63b, and the remaining part of the mixed gas is evacuated at the flow rate Fa through the first evacuation passage 63a.

The evacuation flow rate program 83a includes a group of instructions for generating the table 86 in order to adjust the flow rates of the mixed gases to be evacuated through the evacuation passages 63a, 63b in the above manner. A specific way of generating the table 86 is explained later. The film deposition process program 83b manages reading out a recipe from the first memory 82a depending on types of the film deposition processes and selecting the table 86 corresponding to the process pressures written in the recipe. The opening degree of the butterfly valve 67 and the differential pressure ΔP that correspond to the flow rate Fb of the second evacuation passage 63b are read out from the table 86. Control signals are sent to corresponding actuators of the butterfly valve 67, the first valve 65a, and the second valve 65b, and each process step described later are performed. In this manner, the film deposition process is performed with respect to the wafer W.

The process program 83 is stored in a storage medium 85 such as a hard disk, a compact disk, a magneto-optical disk, a memory card, a flexible disk, or the like and installed to the control portion 83 from the storage medium.

Figure 13:
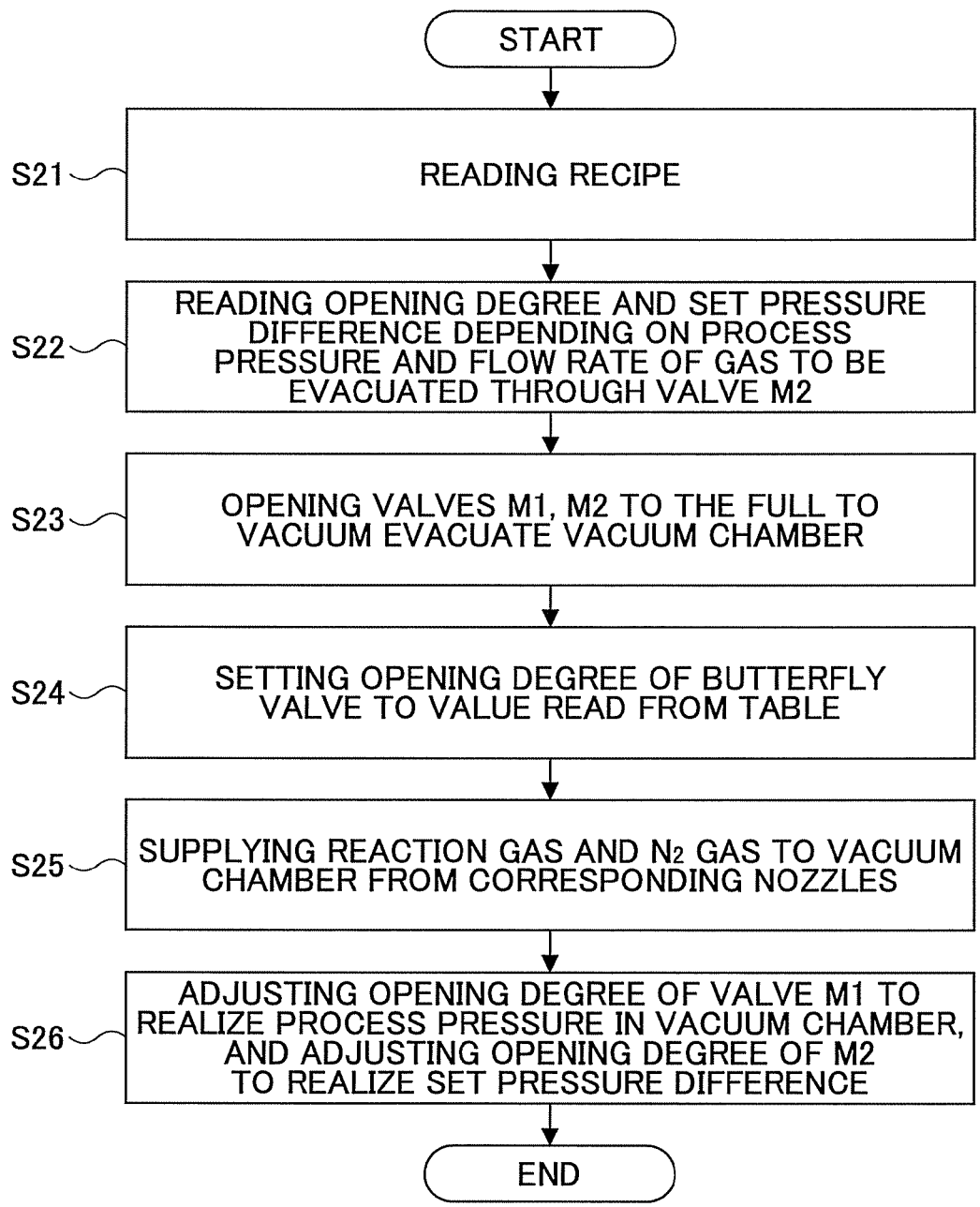
FIG. 13 is a flowchart illustrating a film deposition process in the substrate process apparatus of FIG. 1.
Figure 14:
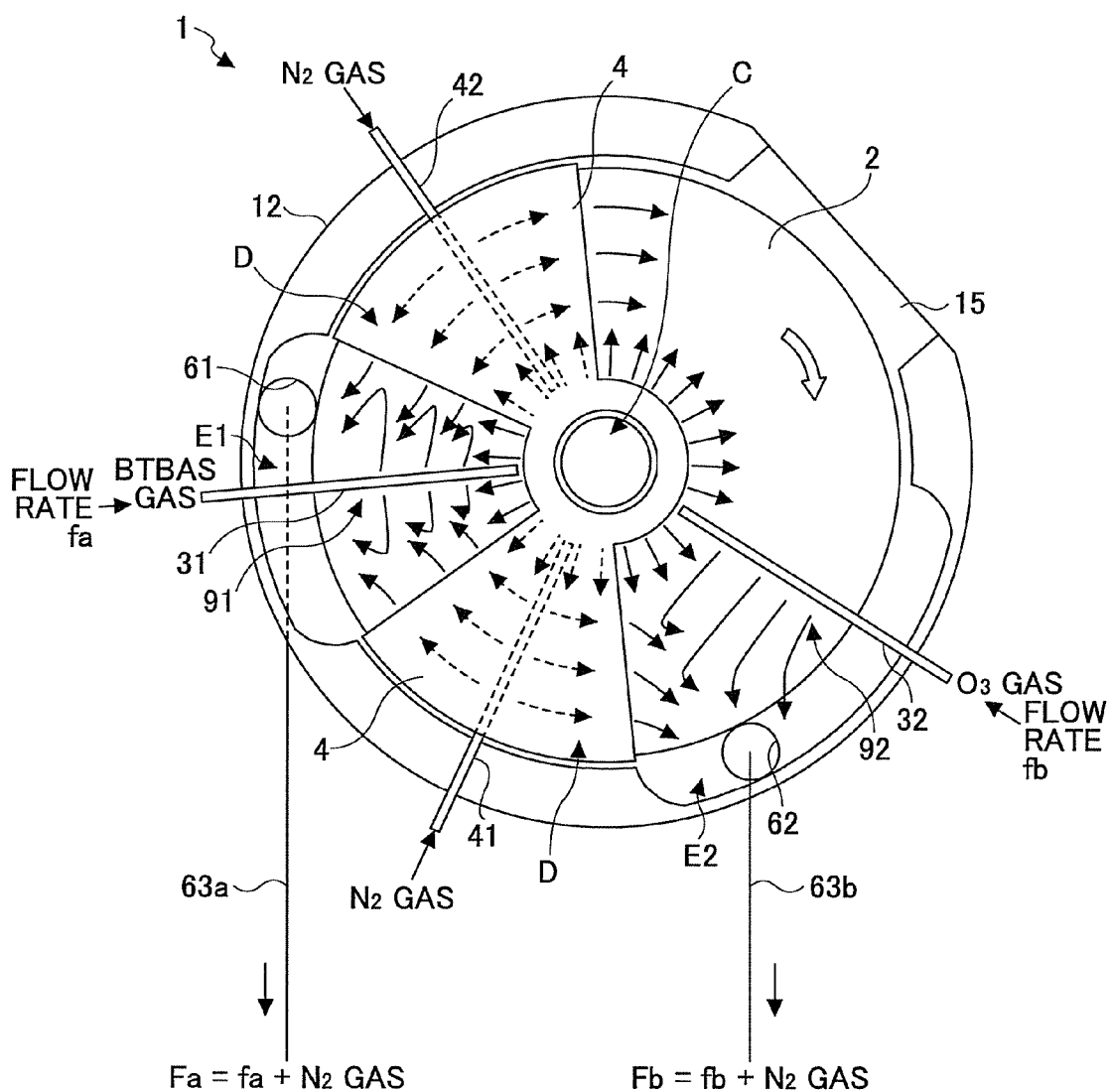
FIG. 14 is a flowchart illustrating gas flows in a vacuum chamber of the substrate process apparatus of FIG. 1.

Next, operations of the first embodiment are explained with reference to FIGS. 12 through 14. First, a process performed by the evacuation flow rate program 83a is explained. According to the evacuation flow rate program 83a, when the film deposition apparatus is first activated, or before the film deposition process is performed or when maintenance of the film deposition apparatus is performed, the set process pressures P and the flow rates Pb of the gas to be evacuated through the evacuation passage 63b are variously changed and the opening degrees of the butterfly valve 67 and the difference pressures ΔP are measured for the corresponding process pressures P and differential pressures ΔP and stored in the form of the table 86 in the second memory 82b. FIG. 11 illustrates an example of the table 86 generated when the set process pressure is 1.07 kPa (8 Torr), although part of opening degree data are omitted in the table 86.

Figure 12:
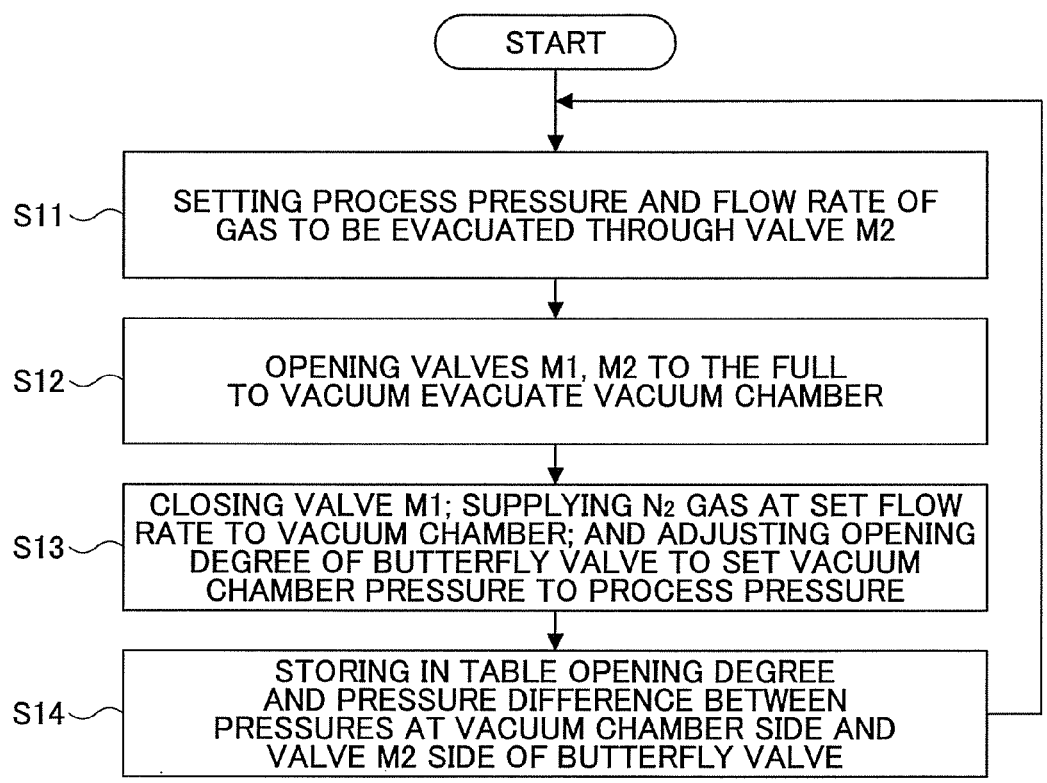
FIG. 12 is a flowchart illustrating an example of procedures to generate the table of FIG. 11.

Specifically, as shown in FIG. 12, when the table 86 is generated, the process pressure P and the flow rate Fb of the gas to be evacuated through the second evacuation passage 63b are determined (step S11). Next, the first valve 65a, the second valve 65b, and the butterfly valve 67 are opened to the full, so that the vacuum chamber 1 is evacuated to the lowest reachable pressure (step S12). Then, the first valve 65a is closed, and $N_2$ gas is supplied to the vacuum chamber 1 through the first reaction gas nozzle 31, the second reaction gas nozzle 32, the two separation gas nozzle 42, the separation gas supplying pipe 51, and the purge gas supplying pipes 72, 73 so that the total flow rate of the $N_2$ gas becomes substantially equal to Fb. Next, the opening degree V of the butterfly valve 67 is adjusted so that the pressure in the vacuum chamber 1 is maintained at the process pressure P (step S13). In addition, the differential pressure ΔP that is caused across the butterfly valve 67 at this time is read out by using the differential pressure gauge 68. The read differential pressure ΔP and the opening degree V of the butterfly valve 67 are stored in association with the process pressure P and the flow rate Fb of the gas to be evacuated through the second evacuation passage 63b (step S14). Then, different sets of the process pressures P and flow rates Fb are determined and the opening degrees V and the differential pressure ΔP are obtained by variously changing the process pressures P and the flow rates Fb, so that the table 86 is generated.

Next, when the film deposition process is performed with respect to the wafer W, a recipe is read out from the first memory 82a (step S21), and then the opening degree V of the butterfly valve 67 and the differential pressure ΔP that correspond to the process pressure P and the flow rate Fb of the gas to be evacuated through the evacuation passage 63b are read out from the table 86 (step S22). In addition, after the gate valve (not shown) is opened, and one of the concave portions 24 of the turntable 2 is in alignment with the transfer opening 15, the wafer W is transferred through the transfer opening 15 by the transfer arm 10 and placed in the concave portion 24 of the turntable 2 by cooperative movement of the elevation pins 16 and the transfer arm 10. Such transfer of the wafer W is repeated by intermittently rotating the turntable 2, and thus five wafers W are placed in the corresponding concave portions 24 of the turntable 2. Then, the valve 65a, 65b and the butterfly valve 67 are open to the full, thereby evacuating the vacuum chamber 1 to the lowest reachable pressure (step S23). The turntable 2 is rotated clockwise at a predetermined rotational speed, and the wafers W (or the turntable 2) are heated to, about 300° C.

Then, the opening degree of the butterfly valve 67 is set to the value read out from the table 86 (step S24). In addition, the BTBAS gas is supplied from the first reaction gas nozzle 31 at the flow rate fa of, for example, 100 sccm and the $O_3$ gas is supplied from the second reaction gas nozzle 32 at the flow rate fb of, for example, 10000 sccm. Moreover, the $N_2$ gas is supplied from each of the separation gas nozzle 41, 42 at a flow rate of 20000 sccm (step S25), and also from the separation gas supplying pipe 51 and the purge gas supplying pipes 72, 73 at predetermined flow rates. Furthermore, as shown in FIG. 10, the opening degree of the first valve 65a is adjusted (or decreased) so that the pressure in the vacuum chamber 1 becomes substantially equal to the process pressure P, and the opening degree of the second valve 65b is adjusted so that a measurement value of the differential pressure gauge 68 becomes substantially equal to the differential pressure ΔP (step S26). Specifically, because the second valve 65b is first open to the full and thus the measurement value of the differential pressure gauge 68 is greater than the differential pressure ΔP, the second valve 65b is adjusted so that the opening degree of the second valve 65b becomes smaller (or is closed to a certain extent). In addition, because the pressure in the vacuum chamber 1 tends to be higher when the opening degree of the second valve 65b is adjusted, the opening degree of the first valve 65a is adjusted (or increased) so that the pressure in the vacuum chamber 1 is maintained at the process pressure P.

In such a manner, the opening degrees of the valves 65a, 65b are alternately and preferably quickly adjusted, so that the pressure in the vacuum chamber 1 becomes substantially equal to the process pressure P and the measurement value becomes substantially equal to the differential pressure ΔP. As a result, a mixed gas (i.e., the BTBAS gas and a part of the total $N_2$ gas supplied to the vacuum chamber 1) is evacuated through the first evacuation passage 63a at the flow rate of Fa, and another mixed gas (i.e., the $O_3$ gas and the remaining part of the $N_2$ gas) is evacuated through the second evacuation passage 63b. In this situation, the BTBAS gas and the $O_3$ gas are impeded from being intermixed with each other in the vacuum chamber 1 and the evacuation passages 63a, 63b, thereby suppressing particle generation. Incidentally, the two evacuation passages 63a, 63b are shown in a simplified form in FIG. 14.

Because the wafer W passes through the first process area 91, the separation area D, the second process area 92, and the other separation area D repeatedly in this order due to the rotation of the turntable 2, the BTBAS gas is adsorbed on the upper surface of the wafer W, and the $O_3$ gas is adsorbed on the upper surface of the wafer W, thereby oxidizing the BTBAS gas to form a layer or layers of silicon oxide. Then, silicon oxide is deposited in layer(s)-by-layer(s) manner on the wafer W, and thus a silicon oxide film is formed on the wafer W. At this time, because the flow rates of gases to be evacuated through the corresponding evacuation passages 63a, 63b are adjusted, the gas-flow to the wafers W does not fluctuate and the gas flow over the wafer(s) is stabilized. In addition, because the flow rates of gases to be evacuated through the corresponding evacuation passages 63a, 63b are adjusted, the wafers W do not go through large pressure changes when the wafers W enter the separation areas D from one of the process areas 91, 92 and come out from separation area D to the other one of the process areas 91, 92. Therefore, the wafers D are not thrown outwardly from the concave portion 24 or moved in the concave portion 24 by such a large pressure change.

In this case, because the $N_2$ gas is supplied in the separation areas D and the center area C, the BTBAS gas and the $O_3$ gas are evacuated without being intermixed with each other. In addition, because the gap between the bent portion 46 and the outer circumferential surface of the turntable 2 is narrow in the separation area D as stated above, the BTBAS gas and the $O_3$ gas are not intermixed through the area between the inner circumferential wall of the chamber body 12 and the turntable 2. Therefore, the first process area 91 and the second process area 92 are fully separated, so that the BTBAS gas is evacuated through the evacuation port 61 and the $O_3$ gas is evacuated through the evacuation port 62. As a result the BTBAS gas and the $O_3$ gas are not intermixed in a gas phase.

In addition, because the area below the turntable 2 is purged with $N_2$ gas, the BTBAS gas that has flowed into the evacuation area E1 cannot flow through the area below the turntable 2 into the second process area 92 to be intermixed with the $O_3$ gas. In addition, the $O_3$ gas that has flowed into the evacuation area E2 cannot flow through the area below the turntable 2 into the first process area 91 to be intermixed with the BTBAS gas.

After the film deposition process is completed in the above-mentioned manner, supplying of the gases is stopped, the vacuum chamber 1 is evacuated to the lowest reachable pressure, and the rotation of the turntable 2 is stopped. Then, the wafers W are transferred out from the vacuum chamber 1 in an opposite procedures to those for transferring in the wafers W into the chamber 1.

An example of process parameters preferable in the film deposition apparatus according to this embodiment is, for example, as follows. A rotational speed of the turntable 2 is, for example, 1-500 rpm (when the wafer W having a diameter of 300 mm is used); a flow rate of $N_2$ gas from the separation gas supplying pipe 51 is, for example, 5000 sccm; and the number of rotations of the turntable 2, namely, the number of times the wafer W passes through the first and the second process areas 91, 92 is, for example, 600 rotations (depending on the film thickness required).

According to this embodiment, when the wafers W are placed on the turntable 2 in the vacuum chamber 1 and the film deposition process is performed with respect to the wafers W, the vacuum chamber 1 is evacuated through the first evacuation passage 63a with the first valve 65a and the second evacuation passage 63b with the second valve 65b, and the opening degree of the first valve 65a is adjusted so that the pressure in the vacuum chamber 1 becomes substantially equal to the process pressure P. In addition, the opening degree of the butterfly valve 67 is adjusted to be the set value stored in the table 86 of the corresponding recipe and the measurement value of the differential pressure gauge 68 is adjusted to be the set differential pressure ΔP stored in the table 86 in order to set the flow rates of the gas to be evacuated through the first evacuation passages 63a, 63b to be the corresponding set values determined for the recipe. Therefore, the flow rates of the gases to be evacuated through the evacuation passages 63a, 63b can be adjusted, so that stabilized gas flows are created in both sides of the separation area D. Because of this, the flows of the reaction gases (BTBAS gas and $O_3$ gas) over the wafer W can be stabilized, so that the BTBAS gas and the $O_3$ gas can be uniformly adsorbed on the wafer W and thus the oxidization of the BTBAS gas with the $O_3$ gas can uniformly take place over the wafer W. As a result, across-wafer and wafer-to-wafer properties and thickness uniformity of the oxide film are improved.

In addition, because evacuation flows on both sides of the separation area D are stabilized, the BTBAS gas is impeded from passing through the separation area D. Therefore, production of by-products is avoided in an area except for the upper surfaces of the wafers W, and thus particle generation can be reduced.

In addition, because the opening degree of the butterfly valve 67 and the differential pressure ΔP that correspond to the flow rate Fb in the first evacuation passage 63b and the process pressure P are calculated before the film deposition process is performed, even if evacuation performances of the corresponding vacuum pump 64a, 64b are different, the flow rates of the gases to be evacuated through the corresponding evacuation passages 63a, 63b can be adjusted. Moreover, because, the calculation of the opening degree of the butterfly valve 67 and the differential pressure ΔP is performed using $N_2$ gas rather than BTBAS gas and $O_3$ gas, adverse influence such as adsorption of the reaction gases and thus generation of particles can be avoided.

As stated, the set values (the opening degree of the butterfly valve 67, the differential pressure ΔP) in the evacuation passages, which correspond to the flow rate of the gas to be supplied to the vacuum chamber 1 under a predetermined process pressure in the vacuum chamber 1, are calculated in advance, and the flow rate of gas to be evacuated through the corresponding evacuation passages 63a, 63b are adjusted based on the calculation results (the table 86), thereby determining the flow rate of gas to be evacuated, in this embodiment of the present invention. In other words, the flow rates of the gases to be evacuated through corresponding evacuation passages 63a, 63b are adjusted using the flow rates of the gases to be supplied into the vacuum chamber 1. Therefore, the flow rates of the gases to be evacuated through corresponding evacuation passages 63a, 63b are accurately adjusted, which impedes the intermixture of the reaction gases and thus enables the film deposition process that can realize excellent across-wafer and wafer-to-wafer uniformities, compared to a conventional method where the flow rate of gas to be evacuated is adjusted by only relying on the pressure gauge.

While the table 86 is generated before the film deposition apparatus is up to the production in the above explanation, the table 86 may be regularly generated, for example, at the time of preventive maintenance. In this case, the table 86 can be generated, even if by-products of the reaction gases are deposited on the inside of the evacuation passages 63a, 63b and the vacuum pumps 64a, 64b or the evacuation performances of the vacuum pumps 64a, 64b are degraded with time.

Furthermore, because the plural wafers W are placed along a circumferential direction of the turntable 2 that in turn is rotated so that the wafers W pass through the first process area 91 and the second process area 92, thereby performing the ALD (or MLD) method, a high-throughput film deposition process is realized. In addition, the separation area D having a low ceiling surface is provided between the first process area 91 and the second process area 92; the separation gas is ejected from the center area C defined by the vacuum chamber 1 and the rotation center portion of the turntable 2 toward the outer circumference of the turntable 2; and the separation gas is also ejected from the separation gas nozzle 41 (42) provided in the separation area D and flows toward the process area 91 and the second process area 92. In this situation, the reaction gases are evacuated through the areas between the outer circumference of the turntable 2 and the inner circumferential surface of the chamber body 12 from the corresponding evacuation ports 61, 62. Therefore, the reaction gases are not intermixed with each other, thereby enabling improved film deposition process. Additionally, almost no by-products of the reaction gases can be produced on the turntable 2, which excludes the wafers W, thereby avoiding particle generation. Incidentally, while the film deposition apparatus according to this embodiment includes the turntable 2 having five concave portions, only one wafer can be placed in the turntable 2.

The reaction gases that may be used as the first reaction gas in the film deposition apparatus according to an embodiment of the present invention are dichlorosilane (DCS), hexachlorodisilane (HCD), Trimethyl Aluminum (TMA), tris(dimethylamino)silane (3DMAS), tetrakis-ethyl-methyl-amino-zirconium (TEMAZ), tetrakis-ethyl-methyl-amino-hafnium (TEMAH), bis(tetra methyl heptandionate) strontium (Sr(THD)2), (methyl-pentadionate)(bis-tetra-methyl-heptandionate) titanium (Ti(MPD)(THD)), monoamino-silane, or the like.

Second Embodiment

Figure 15:
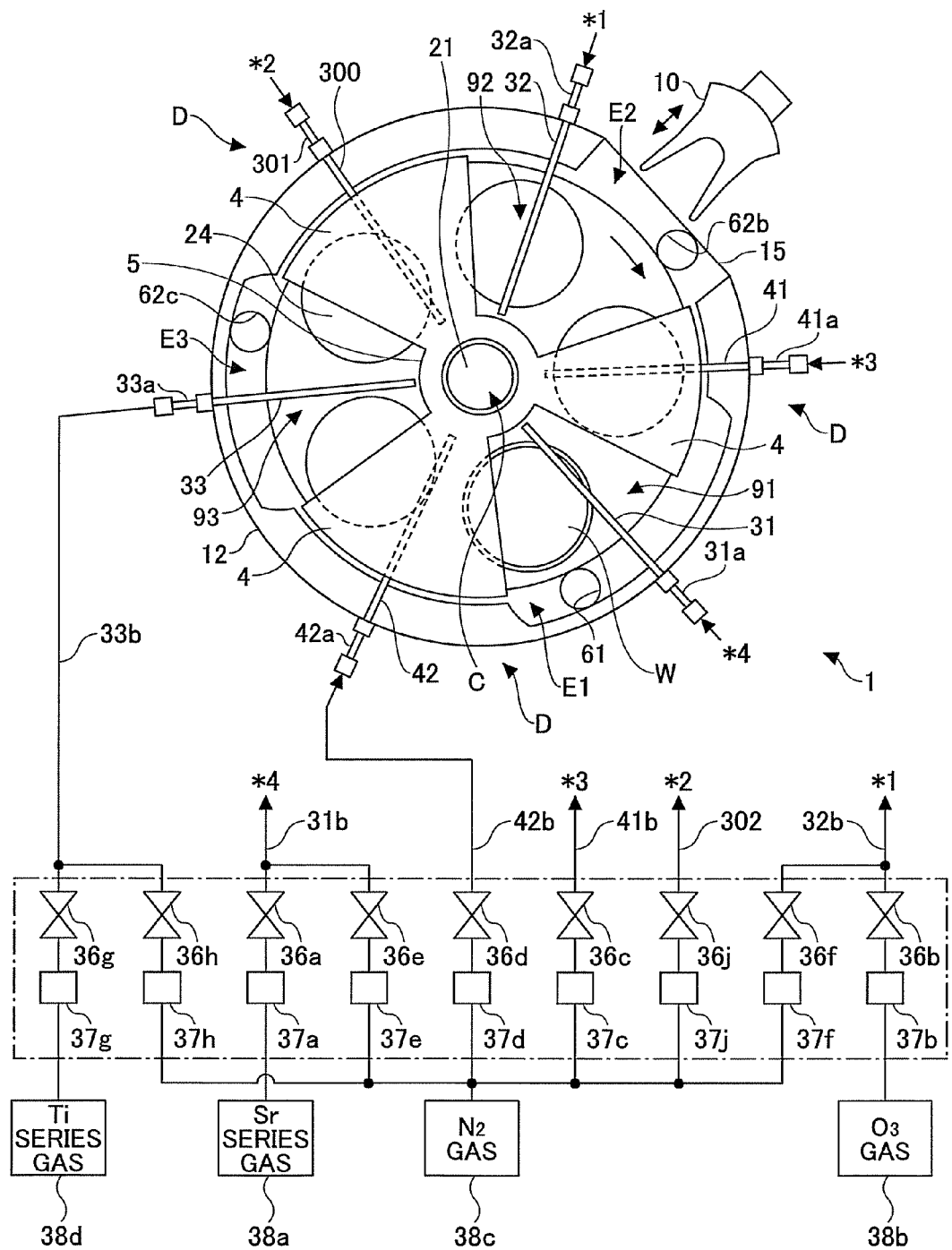
FIG. 15 is a plan view of a substrate process apparatus according to another embodiment of the present invention.

Although the film deposition apparatus having two evacuation passages 63a, 63b has been explained in the first embodiment, a film deposition apparatus according to other embodiments may have three evacuation passages. Such a film deposition apparatus is explained as a second embodiment, with reference to FIGS. 15 and 6. Incidentally, the same reference symbols are given to the components or members explained in the first embodiment, and repetitive explanations are omitted.

In the film deposition apparatus according to the second embodiment, there are provided three reaction gas nozzles 31, 32, 33. A separation area D is arranged between the first process area 91 where a first reaction gas is supplied from the reaction gas nozzle 31 and the second process area 92 where a second reaction gas is supplied from the second reaction gas nozzle 32, and is provided with the separation gas nozzle 41. In addition, another separation area D is arranged between the first process area 91 where the first reaction gas is supplied and a separation area 93 where a third reaction gas is supplied, and is provided with the separation gas nozzle 42. Moreover, yet another separation area D is arranged between the process area 92 and the process area 93, and is provided with a separation gas nozzle 300. The separation gas nozzle 41, the reaction gas nozzle 31, the separation gas nozzle 42, the reaction gas nozzle 33, the separation gas nozzle 300, and the reaction gas nozzle 32 are arranged in a clockwise order from the transfer opening 15.

The reaction gas nozzle 31 is connected to a first gas supplying source 38a that stores a strontium source such as bis(tetra methyl heptandionate) strontium $(Sr(THD)_2)$ bis (pentamethylcyclopentadienyl)strontium $((Sr(Me5 Cp)_2)$, or the like. The reaction gas nozzle 32 is connected to a second gas supplying source 38b. In addition, the reaction gas nozzle 33 is connected to a third gas supplying source 38d that stores a titanium source such as (bisisopropoxo)(bis(tetramethyl-heptanedionato))-titanium $(Ti(OiPr)_2 (THD)_2)_2)$, (tetraisopropoxo)-titanium (Ti(OiPr)) or the like. The reaction gas nozzle 33 is configured in the same manner as the reaction gas nozzle 32, so that $N_2$ gas is supplied to the reaction gas nozzle 32 from the $N_2$ supplying source 38c. Incidentally, a reference symbol 33b indicates a gas supplying line; reference symbols 36a through 36h and 36j indicates valves; reference symbols 37a through 36h and 36j indicate flow rate adjusting portions; and a reference symbol 301 indicates a gas inlet port.

Figure 16:
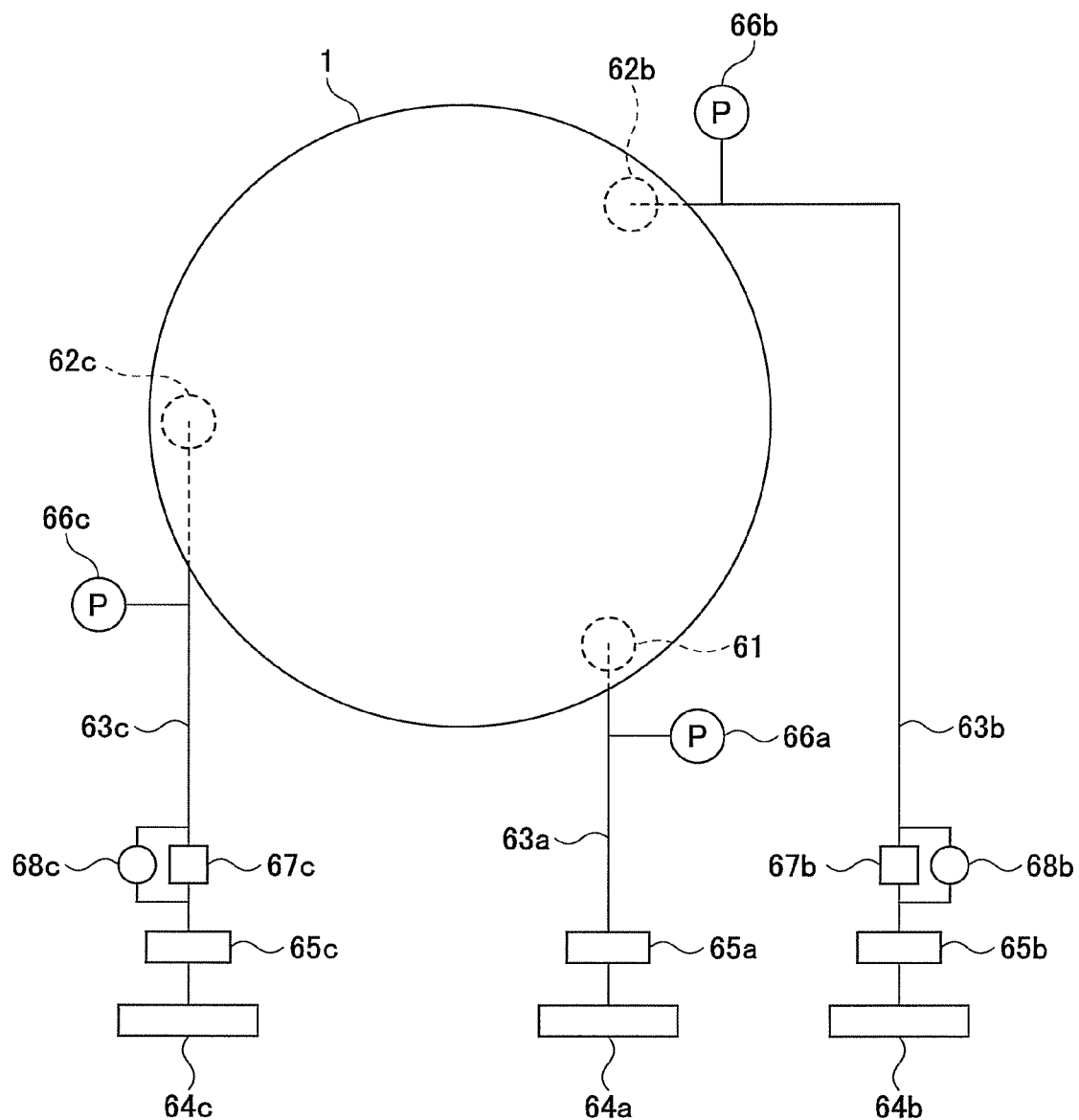
FIG. 16 is a schematic view illustrating the substrate process apparatus of FIG. 15.

The evacuation port 61 is formed between the process area 91 and the separation area D located downstream relative to the rotation direction of the turntable 2 in relation to the process area 91. An evacuation port 62b is formed between the process area 92 and the separation area D located downstream relative to the rotation direction of the turntable 2 in relation to the process area 92. An evacuation port 62c is formed between the process area 93 and the separation area D located downstream relative to the rotation direction of the turntable 2 in relation to the process area 93. As shown in FIG. 16, the second evacuation passage 63b extending from the evacuation port 62b is provided with a butterfly valve 67b, a differential pressure gauge 68b, the second valve 65b, and a vacuum pump 64b. A third evacuation passage 63c extending from the evacuation port 62c is provided with a pressure measurement instrument 66c, a butterfly valve 67c, a differential pressure gauge 68c, a third valve 65c, and a vacuum pump 64c. Incidentally, the film deposition apparatus is illustrated in a simplified form in FIG. 16.

Figure 17:
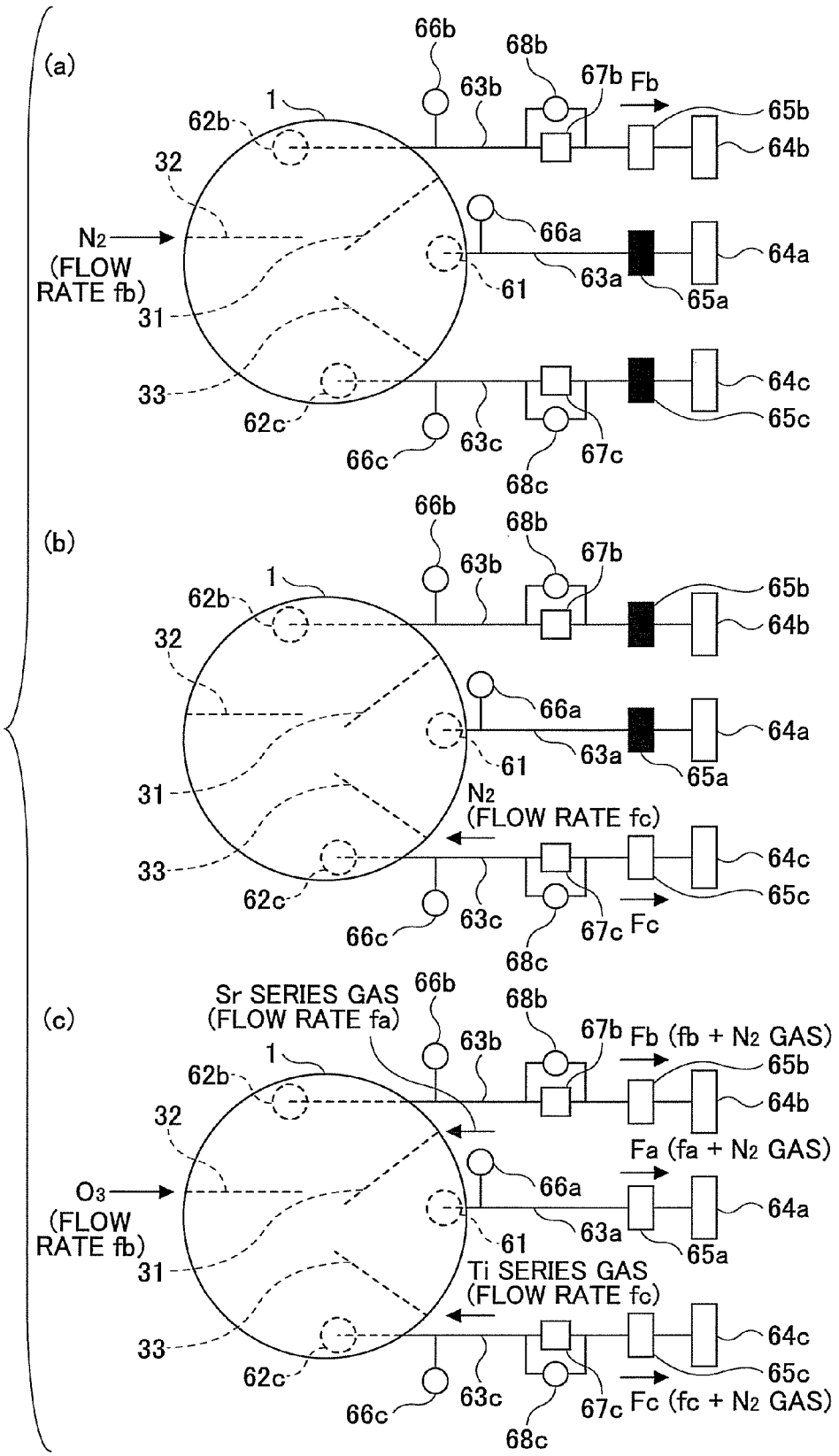
FIG. 17 is a schematic view illustrating procedures to generate the table in the substrate process apparatus of FIG. 15.
Figure 18:
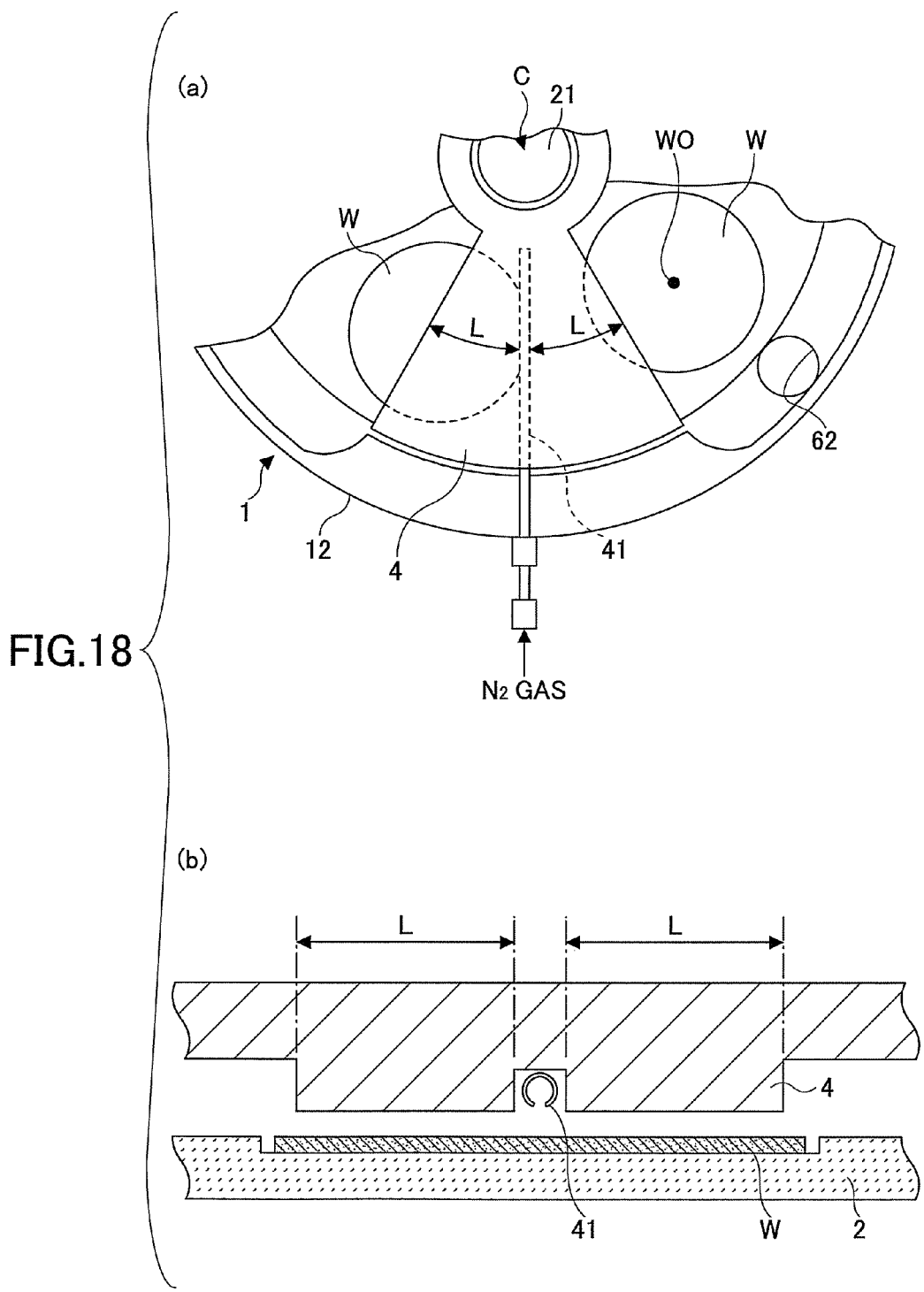
FIG. 18 is a schematic view for explaining an example of a size of a convex portion used in a separation area of a substrate process apparatus serving as a film deposition apparatus.
Figure 19:
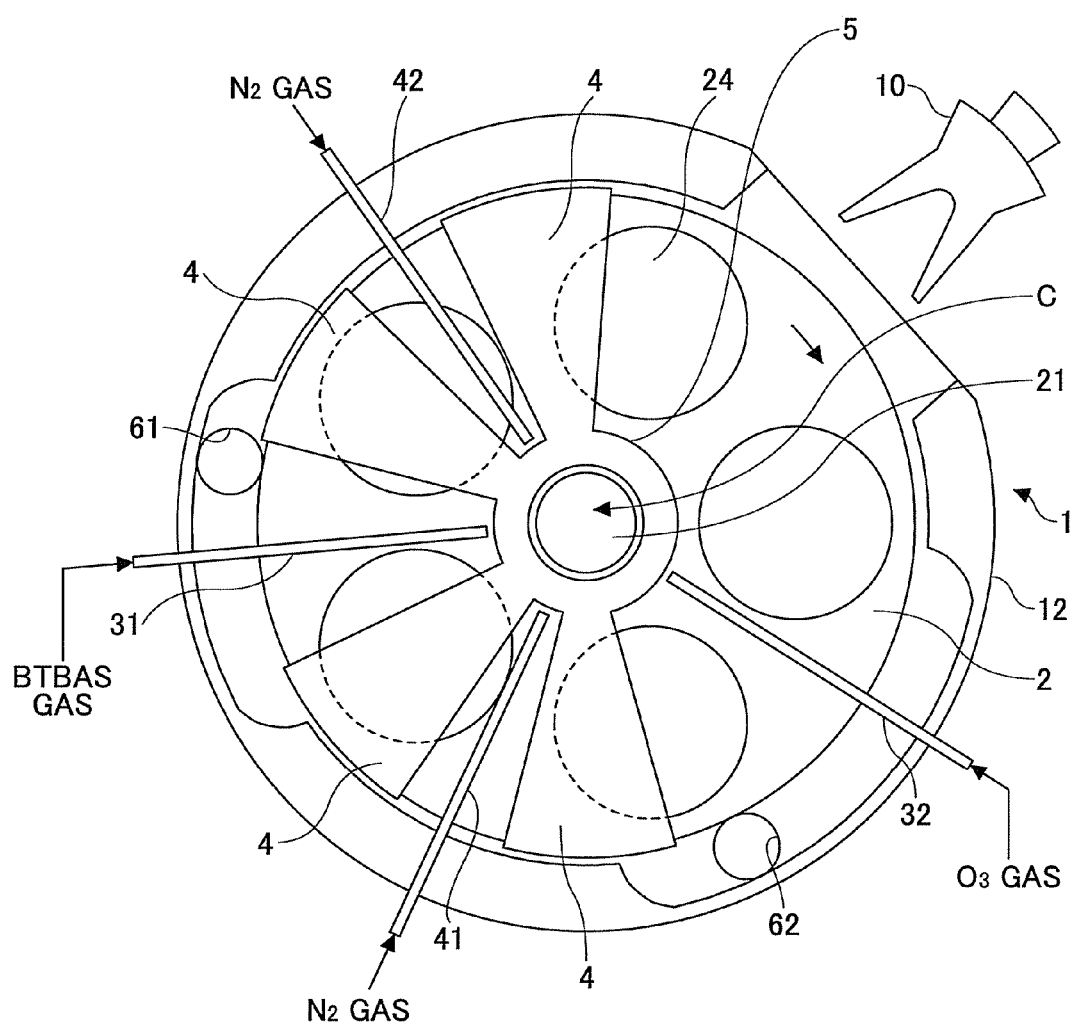
FIG. 19 is a cross-sectional view illustrating another example of separation area.

When the table 86 is generated in this embodiment, the first valve 65a and one of the second valve 65b and the third valve 65c (the third valve 65c in the this case) are closed as shown in Subsection (a) of FIG. 17. Next, the $N_2$ gas is supplied at the flow rate Fb to the vacuum chamber 1, and the opening degree of the butterfly valve 67b is adjusted so that the pressure in the vacuum chamber 1 becomes substantially equal to the process pressure P and the flow rate of gas to be evacuated through the second evacuation passage 63b becomes substantially equal to Fb. Then, the opening degree V and the measurement value (the differential pressure ΔP) of the differential pressure gauge 68b are written in the table 86. Next, while the first valve 65a is kept closed, the second valve 65b is closed and the third valve 65c is opened, as shown in Subsection (b) of FIG. 17. Then, the $N_2$ gas is supplied at the flow rate Fc to the vacuum chamber 1, and the opening degree of the butterfly valve 67b is adjusted so that the pressure in the vacuum chamber 1 becomes substantially equal to the process pressure P and the flow rate of gas to be evacuated through the third evacuation passage 63c becomes substantially equal to Fc. Then, the opening degree V and the measurement value (the differential pressure ΔP) of the differential pressure gauge 68c are written in the table 86. Incidentally, the valves 65a, 65b, 65c are illustrated as open squares when they are open and as closed square when they are closed. In addition, while the $N_2$ gas is supplied to the vacuum chamber 1 from the separation gas nozzles 41, 42, 300 and the like in addition to the reaction gas nozzles 32, 33, FIG. 17 illustrates that the N₂ gas is supplied only from the reaction gas nozzles 32, 33, for the sake of convenience.

Then, when the film deposition process is performed, a recipe to be used is read out, and then the opening degrees V of the valves 65b, 65c and the differential pressures ΔP are read out from the table 86. Next, the opening degrees of the valves 65b, 65c are adjusted to be the read-out value V, and the reaction gases are supplied from the corresponding reaction gas nozzles 31, 32, 33 at the corresponding flow rates fa, fb, fc, and the N₂ gases are supplied from the separation gas nozzles 41, 42, 300 and the supplying pipes 51, 62, 73 at the corresponding flow rates. Then, while the first valve 65a is adjusted so that the pressure in the vacuum chamber 1 becomes substantially equal to the process pressure P, the opening degrees of the first valve 65b and the third valve 65c are adjusted so that the readings of the differential pressure gauges 68b, 68c become substantially equal to the read-out value ΔP. As a result, the flow rate of gas to be evacuated through the second evacuation passage 63b becomes substantially equal to Fb, which corresponds to the flow rate fb and a flow rate of a part of the N₂ gas among the total N₂ gas supplied to the vacuum chamber 1, and the flow rate of gas to be evacuated through the third evacuation passage 63c becomes substantially equal to Fc, which corresponds to the flow rate fc and a flow rate of a part of the N₂ gas among the total N₂ gas supplied to the vacuum chamber 1, as shown in Subsection (c) of FIG. 17. Therefore, the flow rate of gas to be evacuated through the first evacuation passage 63a is equal to a flow rate obtained by subtracting the flow rates Fb and Fc from the total flow rate of all the reaction gases and the total N₂ gas, or summation of the flow rate fa and the flow rate of the remaining N₂ gas. According to this, the reaction gases are evacuated through the corresponding evacuation passages 63a, 63b, 63c without being intermixed with one another in the vacuum chamber 1. The flow rates fa, fb, fc are, for example, 5000 sccm.

With such flows created in the vacuum chamber 1, the reaction gas containing Sr is adsorbed on the wafer W; the reaction gas containing Ti is adsorbed on the wafer W; and then the adsorbed gases are oxidized when the wafer W passes through the corresponding process areas 91, 92, 93 by rotating the turntable 2. After these adsorptions and oxidization are repeated, a strontium titanium oxide (STO) film having a predetermined thickness is deposited on the wafer W.

The same effects and advantages as those of the first embodiment are obtained in the second embodiment. Incidentally, when the flow rates of gas to be evacuated through the evacuation passages 63b, 63c are the same and the vacuum pumps 64b, 64c have the same evacuation performance, the table 86 may be generated only for one of the evacuation passages 63b, 63c and this table 86 may be used for the other evacuation passages 63b, 63c. In addition, while three reaction gases are supplied to the vacuum chamber 1 in the second embodiment, four or more reaction gases may be supplied in other embodiments. Even in this case, the table 86 can be generated in the same manner as explained in the second embodiment.

Incidentally, an upstream portion of the ceiling surface 44 in the separation area D relative to the rotation direction of the turntable 2 in relation to the correspond separation gas nozzle 41, 42, 300 preferably has a larger width. The reason is that a flow speed of the gas flowing toward the separation area D becomes higher closer to the outer circumference of the convex portion 4. In view of this, it is preferable for the convex portion 4 to have a sector-shaped top view, as explained in the above embodiment.

In addition, the ceiling surface 44 that creates the thin space in both sides of the separation gas nozzle 41 (42, 300) may preferably have a length L of 50 mm or more along an arc that corresponds to a route through which a wafer center WO passes, when the wafer W has a diameter of 300 mm. When the length L is small, the height h of the thin space between the ceiling surface 44 and the turntable 2 (wafer W) has to be accordingly small in order to effectively prevent the reaction gases from flowing into the thin space. In addition, when the height h between the first ceiling surface 44 and the turntable 2 is set to be a certain value, a length along an arc needs to be larger toward the outer circumference of the convex portion 4 because the gas flow speed becomes larger toward the outer circumference of the convex portion 4. From a viewpoint of this, when the length L is smaller than 50 mm along the arc that corresponds to a route through which a wafer center WO passes, the height h has to be extremely small. In this case, measures to damp vibration of the turntable 2 or measures to stably rotate the turntable 2 are required in order to avoid the turntable 2 hitting the ceiling surface 44. Moreover, when the rotation speed of the turntable 2 is larger, the reaction gas becomes likely to flow at a higher speed toward the separation area D and enter the narrow space in the separation area (between the convex portion 4 and the turntable 2). Therefore, when the length L is smaller than 50 mm, the rotation speed of the turntable 2 needs to be smaller, thereby adversely influencing throughput. In view of the above, the length L is preferably 50 mm or more, although gas separation effects can be obtained with the length L of smaller than 50 mm, depending on the circumstances. The length L ranging from about one-tenth of a diameter of the wafer W through about a diameter of the wafer W, preferably, about one-sixth or more of the diameter of the wafer W along the arc that corresponds to a route through which a wafer center WO passes.

Incidentally, the separation portion 4 is created by attaching the convex portion 4 on the back surface of the ceiling plate 11 and arranging the separation gas nozzle 41 (42, 300) in the groove of the convex portion in the above embodiments. However, the convex portion 4 may have in its inside a as flow passage that extends along a radius direction of the turntable 2, and plural openings that are in gaseous communication with the gas flow passage and the vacuum chamber 1. In this case, the gas flow passage and the plural openings serve as the separation gas nozzle 41 (42, 300).

The separation area D may be configured by attaching two sector-shaped plates on the back surface of the ceiling plate 11 so that the two sector-shaped plates are located on both sides of the separation gas nozzle 41 (41, 300). In this case, the size of the two sector-shaped plates may be determined so that an effective separation effect is obtained by the separation area D, taking into consideration the flow rates of the separation gases and the reaction gases.

In the above embodiments, the process areas 91, 92, 93 are provided below the ceiling surface 45 that is higher than the ceiling surface 44 of the separation area D. However, at least one of the process areas 91, 92, 93 may be accompanied by the lower ceiling surfaces 44 on both sides, in the same manner as the separation gas nozzle 41 (42, 300).

Moreover, a ceiling surface, which is lower than the ceiling surface 45 and as low as the ceiling surface 44 of the separation area D, may be provided in both sides of the reaction gas nozzles 31 (32, 33) and extended to reach the ceiling surfaces 44 in other embodiments. In other words, the lower ceiling surface 44 opposes substantially the entire upper surface of the turntable 2, except for positions where the reaction gas nozzles 31 (32, 33) and the separation gas nozzles 41 (42, 300). Even in this case, the same effect is obtained. Seen from a different viewpoint, this configuration can be realized by extending the first ceiling surface 44 for the separation gas nozzles 41 (42, 300) to the reaction gas nozzles 31, (32, 33). In this case, the reaction gases spread to both sides of the corresponding reaction gas nozzles 31 32, 33 below the corresponding convex portions 4 (or in the thin space) and the separation gases spread to both sides of the corresponding separation gas nozzles 41, 42, 300. The reaction gas and the separation gas flow into each other in the thin space and are evacuated through the evacuation port 61 (62, 63).

Figure 20:
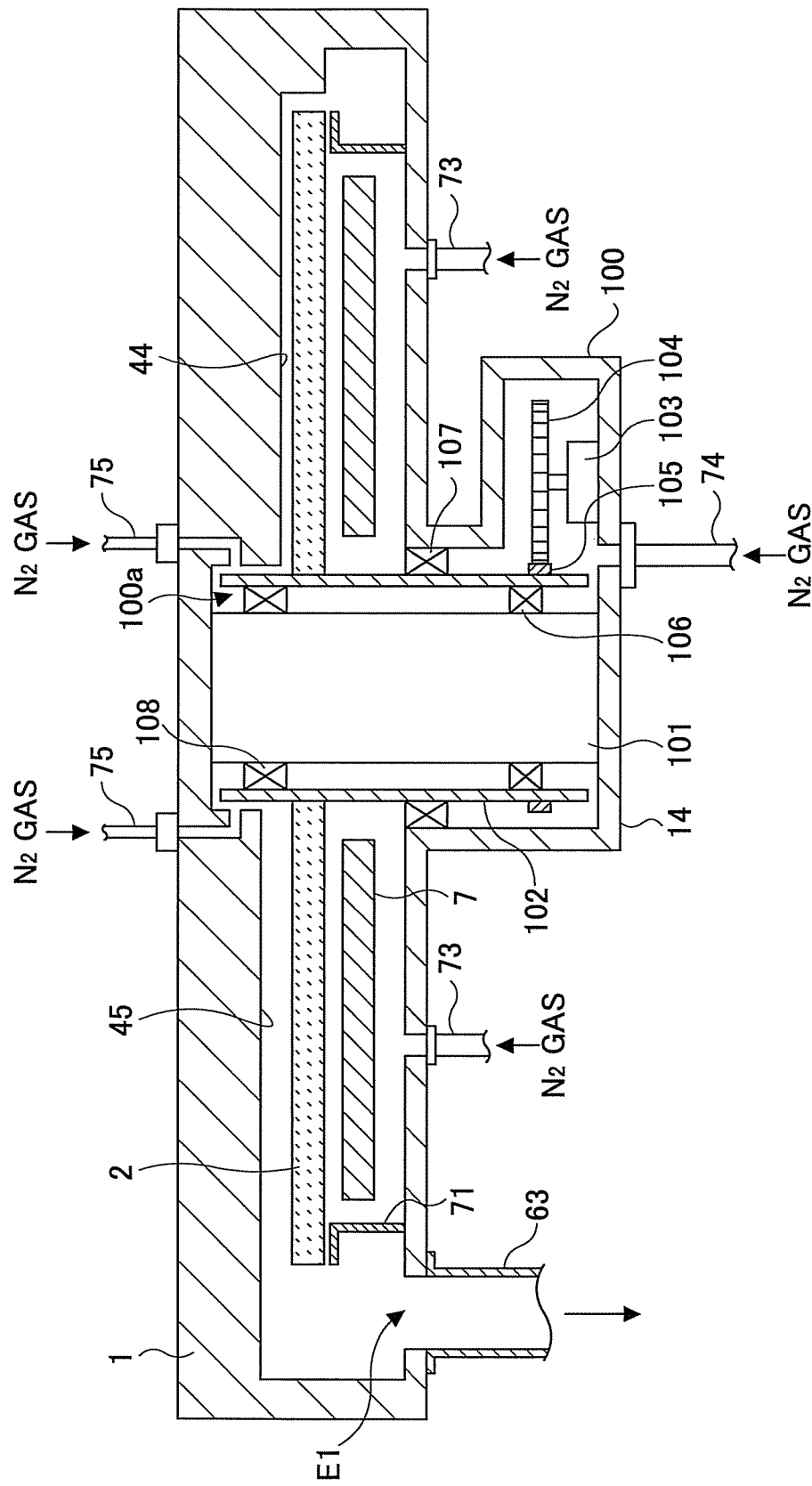
FIG. 20 is a cross-sectional view illustrating another substrate process apparatus serving as a film deposition apparatus according to an embodiment of the present invention.

In the above embodiments, the rotational shaft 22 for rotating the turntable 2 is located in the center portion of the vacuum chamber 1. In addition, the space 52 between the core portion 21 and the ceiling plate 11 is purged with the separation gas in order to prevent the reaction gases from being intermixed through the center portion. However, the vacuum chamber 1 may be configured as shown in FIG. 20 in other embodiments. Referring to FIG. 20, a bottom portion of the vacuum chamber 1 is projected downward at the center to form a housing space 100 where a driving portion is housed. Additionally, a top portion of the vacuum chamber 1 is projected at the center to form a concave portion 100a. A pillar 101 is placed on the bottom surface of the housing space 100, and a top end portion of the pillar 101 reaches a bottom surface of the center concave portion 100a. The pillar 101 can impede the first reaction gas (BTBAS) ejected from the first reaction gas nozzle 31 and the second reaction gas ($O_3$) ejected from the second reaction gas nozzle 32 from being intermixed through the center portion of the vacuum chamber 1.

In addition, a rotation sleeve 102 is provided so that the rotation sleeve 102 coaxially surrounds the pillar 101. The rotation sleeve 102 is supported by bearings 106, 108 attached on an outer surface of the pillar 101 and a bearing 107 attached on an inner side wall of the housing case 100. Moreover, the rotation sleeve 102 has a gear portion 105 formed or attached on an outer surface of the rotation sleeve 102. Furthermore, an inner circumference of the ring-shaped turntable 2 is attached on the outer surface of the rotation sleeve 102. A driving portion 103 is housed in the housing case 100 and has a gear 104 attached to a shaft extending from the driving portion 103. The gear 104 is meshed with the gear portion 105. With such a configuration, the rotation sleeve 102 and thus the turntable 2 are rotated by a driving portion 103. A purge gas supplying pipe 74 is connected to the bottom portion of the housing case 100, so that a purge gas is supplied into the housing case 100. In addition, purge gas supplying pipes 75 are connected to the upper portion of the vacuum chamber 1. Although the two purge gas supplying pipes 75 are connected in order to supply $N_2$ gas to a space between the rotation sleeve 102 and the center concave portion 100a in FIG. 20, the number of the purge gas supplying pipes 75 is preferably determined so that the first reaction gas and the second reaction gas are not intermixed through the center area.

In the embodiment illustrated in FIG. 20, a space between the side wall of the concave portion 100a and the upper end portion of the rotation sleeve 102 corresponds to the ejection hole for ejecting the separation gas. In addition, the center area is configured with the ejection hole, the rotation sleeve 102, and the pillar 101.

In addition, while the turntable 2 is rotated in relation to the gas supplying system (the nozzles 31, 32, 33, 41, 42, 300) in the above embodiments, the gas supplying system may be rotated along a circumferential direction of the vacuum chamber 1 in relation to the turntable 2 that is stationary in this case.

Third Embodiment

While the film deposition apparatus according to embodiments of the present invention has been described, where plural reaction gases that are reacted with one another are supplied to the vacuum chamber 1, thereby depositing a film on the wafers W, the present invention may be applied to an etching apparatus, where a process gas (etching gas) is supplied to a vacuum chamber, thereby performing an etching process. Such an etching apparatus is explained as a third embodiment, with reference to FIGS. 21 and 22.

Figure 21:
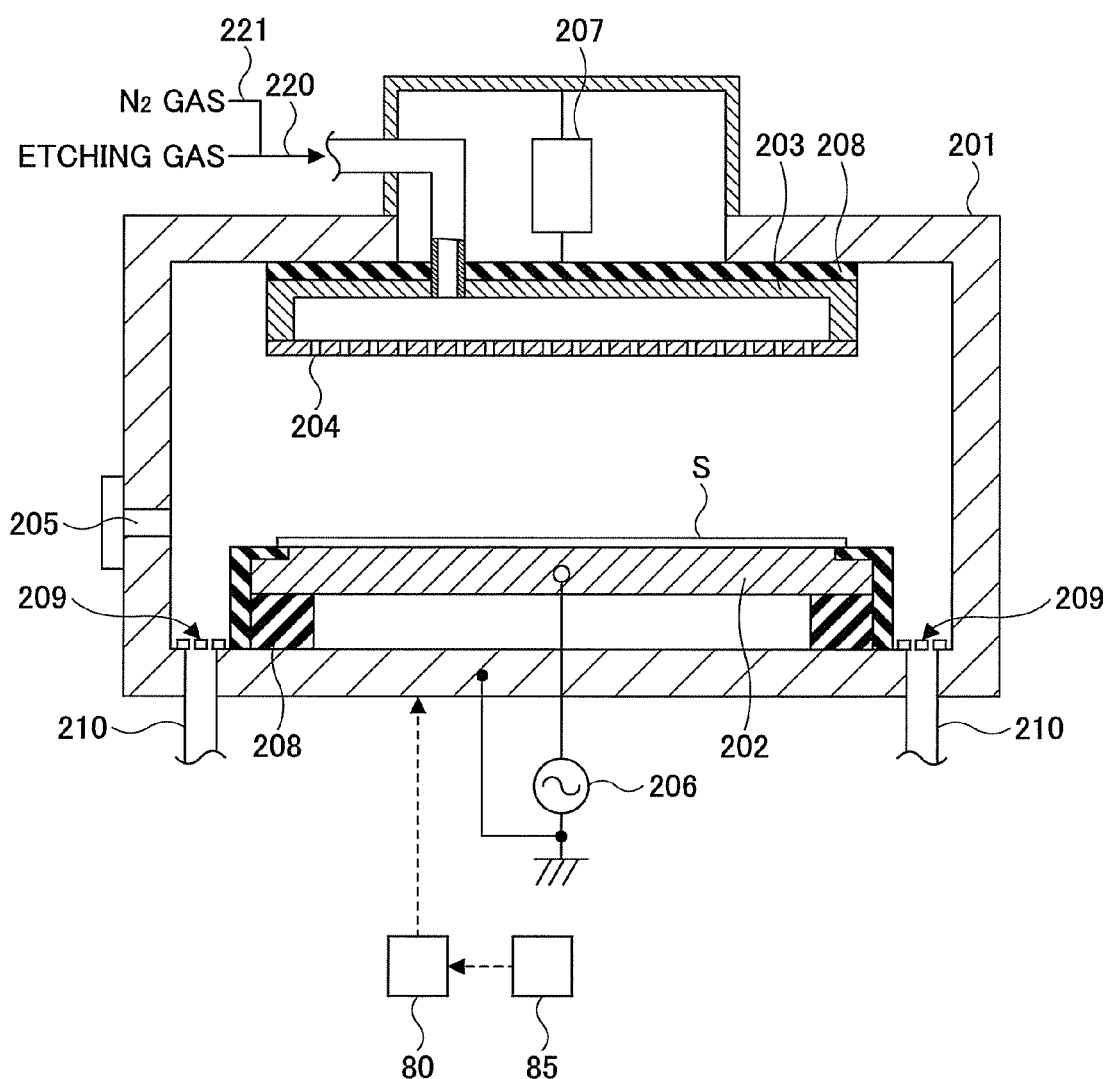
FIG. 21 is a side view illustrating an example of a substrate process apparatus according to yet another substrate process apparatus.

In FIG. 21, a reference symbol 201 indicates a vacuum chamber and a reference symbol 202 indicates a susceptor on which a substrate S such as a square glass substrate for a Liquid Crystal Display (LCD) or a Flat Panel Display (FPD) having a side length of about several meters is placed. The susceptor 202 serves as a lower electrode. In an upper area of the vacuum chamber 201, a shower head 203 serving as a process gas supplying portion is provided. A halogen series electro-negative gas such as chlorine gas serving as a process gas against the substrate S on the susceptor 202 is supplied to the vacuum chamber 201 through the shower head 203. The shower head 203 is connected to a process gas supplying conduit 220 for supplying the process gas into the inner area of the shower head 203, and an $N_2$ gas supplying conduit 221 for supplying $N_2$ gas serving as a flow rate control gas, via valves and flow rate controllers (not shown). In addition, in FIG. 21, reference symbols 204 indicate gas ejection holes serving as process gas supplying opening formed a lower surface of the showerhead 203; a reference symbol 205 indicates a transfer opening through which the substrate S is transferred into or out from the vacuum chamber 201; a reference symbol 206 indicates a high-frequency power source for supplying high-frequency waves to the susceptor 202 in order to generate plasma in the vacuum chamber 201; a reference symbol 207 indicates an impedance adjustment mechanism; and reference symbols 208 indicate insulation members.

Figure 22:
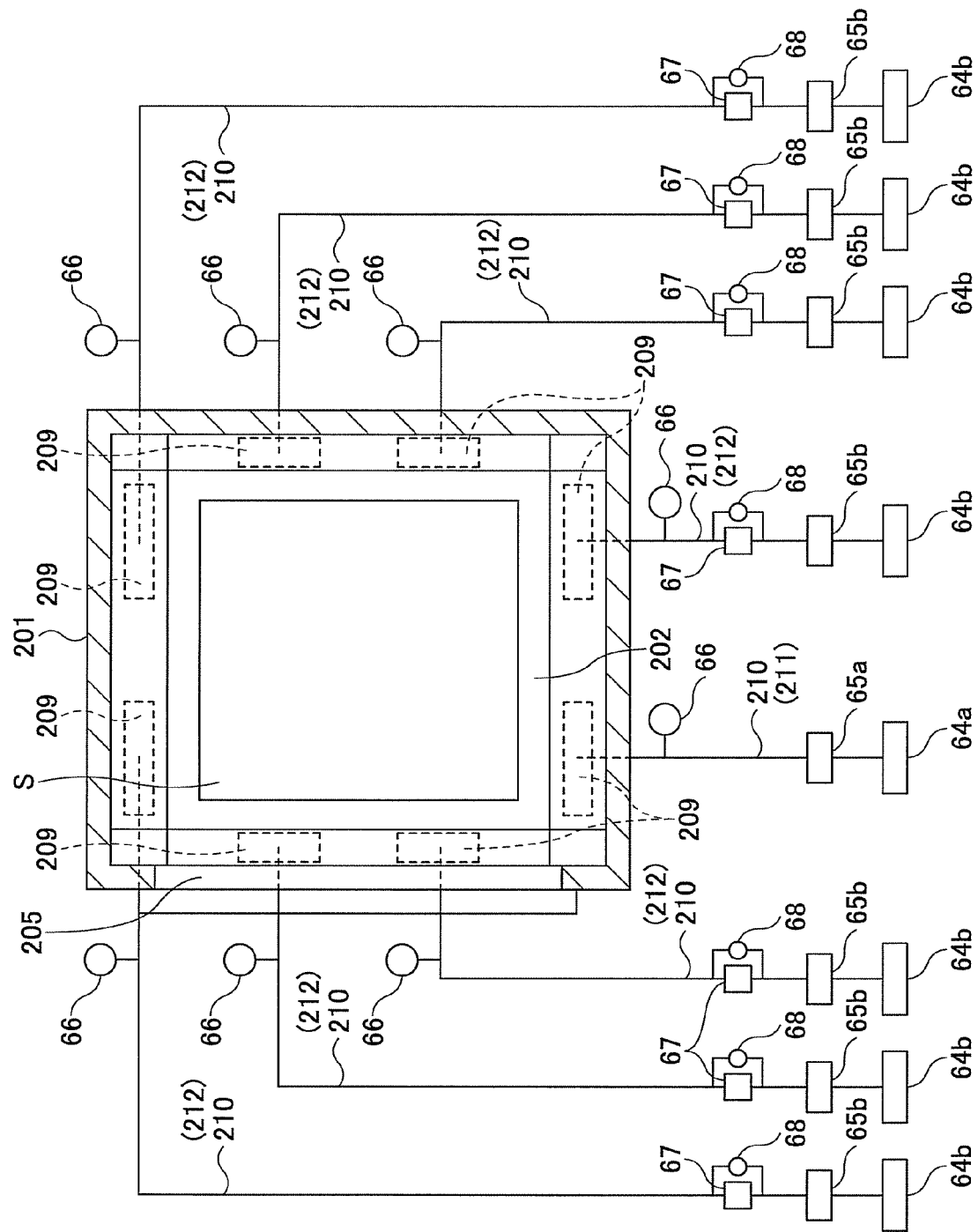
FIG. 22 is a plan view illustrating the substrate process apparatus of FIG. 22.

In addition, plural (e.g., eight) evacuation ports 209 are formed at equal intervals in order to surround the susceptor 202 or to be located along four sides of the susceptor 202 in a bottom of the vacuum chamber 201, as shown in FIG. 22. One of evacuation passages that extend from the corresponding evacuation ports 209 is referred to as a first evacuation passage 211, and the rest of the evacuation passages are referred to as a second evacuation passage 212, hereinafter. The first evacuation passage 211 is provided with the first valve 65a and connected to the vacuum pump 64a. In addition, the second evacuation passages 212 are provided with the corresponding butterfly valves 67, the corresponding differential pressure gauges 68, and the corresponding second valves 65b and connected to the corresponding vacuum pumps 64b. These valves and vacuum pumps having the same reference symbols as those in the first embodiment have the same functions as those valves and vacuum pumps in the first embodiment.

Even in this substrate process apparatus, when the table 86 (FIG. 11) is generated, the same procedures as explained in the second embodiment are taken. Specifically, the first valve 65 of the first evacuation passage 211 and the second valves 65b, except for one of the second valves 65b in one of the second evacuation passages 212, are closed. Namely, one of the second valves 65b in one of the second evacuation passage 212 is open. Then, $N_2$ gas is supplied to the vacuum chamber 201 at the flow rate of Fb; the opening degree of the butterfly valve 67 in the one of the evacuation passages 212 is adjusted so that the pressure in the vacuum chamber 1 becomes substantially equal to a process pressure P; and then the opening degree V and the differential pressure ΔP are written in the table 86. Such procedures are performed for each of the remaining second evacuation passages 212 thereby to obtain all the data about the opening degrees and the differential pressures. As a result, the table 86 is generated.

When an etching process is performed in the substrate process apparatus, a recipe and the table 86 corresponding to the recipe are read out; the substrate S is transferred into the vacuum chamber 201 through the transfer opening 205 and placed on the susceptor 202; and the valves 65a, 65b are open to the full in order to evacuate the vacuum chamber 205 to the lowest reachable pressure. Next, the opening degrees of the butterfly valves 67 are set to be the opening degrees read out from the table 86. Then, the etching gas is supplied to the shower head 203 from the process gas supplying conduit 220, and thus the etching gas flows toward the substrate S from the gas ejection holes 204. Next, the opening degree of the first valve 65a is adjusted so that the pressure in the vacuum chamber 201 becomes substantially equal to the process pressure P, and the opening degrees of the second valves 65b are adjusted so that the readings of the differential pressure gauges 68 become substantially equal to the differential pressure ΔP. Additionally, high-frequency waves having a predetermined frequency are supplied at a predetermined electric power to the susceptor 202 from the high-frequency power source 206, thereby activating the etching gas into plasma, and thus a thin film of, for example, aluminum formed on the substrate S is etched. In this case, the flow rates of gas to be evacuated from the evacuation ports 209 are adjusted based on the table 86, the flow rates of gas to be evacuated through the evacuation passages 210 is adjusted to be predetermined flow rates (the same in this example). Therefore, the plasma can be uniformly generated in the vacuum chamber 201, and by-products produced by this etching process are smoothly or stably evacuated. As a result, a uniform etching process is performed. In other words, the same effects and advantages as explained in the precedent embodiments can be obtained even in the third embodiment.

Incidentally, because the pressures measured by the pressure measurement instruments 66a, 66b, 66c are substantially the same in each of the above embodiments, one measurement value of one of the measurement instruments 66a, 66b, 66c may be used when the table 86 is generated or when the opening degree of the first valve 65a is adjusted so that the pressure in the vacuum chamber 1 becomes substantially equal to the process pressure P. Alternatively, a pressure measurement value of another pressure gauge provided in the vacuum chamber 1 (201) may be used. Moreover, while the differential pressure gauge 68 is arranged across the butterfly valve 67 in order to measure the differential pressure ΔP, the differential pressure may be obtained by using a pressure in the evacuation passage 63b, which may be measured by a pressure gauge provided between the butterfly valve 67 and the second valve 65b, and a pressure measured by one of the measurement instruments 66a, 66b, 66c (66) or another pressure gauge provided in order to measure the pressure in the vacuum chamber 1 (201). In this case, a differential pressure measurement portion is composed of the pressure gauge provided between the butterfly valve 67 and the second valve 65b, the first pressure measurement instruments 66a, 66b, 66c (66), and a calculation portion that obtains the differential pressure ΔP from the measurement values from the pressure gauge provided between the butterfly valve 67 and the second valve 65b and the first pressure measurement instruments 66a, 66b, 66c (66).

Moreover, when the table 86 is generated, the process pressure P is substantially the same as the pressure measured at the upstream side of the butterfly valve 67 measured by the differential pressure gauge 68, as shown in FIG. 11. Therefore, the pressure between the butterfly valve 67 and the second valve 65b is written in the table 86 instead of the differential pressure ΔP, and then the opening degree of the second valve 65b may be adjusted so that the pressure between the butterfly valve 67 and the second valve 65b becomes substantially equal to the pressure written in the table 86, when the flow rates of gas to be evacuated through the evacuation passages 63a, 63b, 63c.

In the above explanation, terms of "first" and "second" are used in order to distinguish one evacuation passage from the other. Any one of the plural evacuation passages may be assigned to be the first evacuation passage 63a (211); the other evacuation passage(s) is assigned to be the second evacuation passage(s) 63b (212) having the butterfly valve(s) 67 and the differential pressure gauge(s) 68; and the table 86 is generated for the second evacuation passage(s) 63b. In addition, the plural evacuation passages 63b may be connected to a common single vacuum pump. Moreover, while two evacuation passages 210 may be provided instead of the eight evacuation passages 210 in the vacuum chamber 201 of FIGS. 21 and 22.

While the substrate process apparatus serving as the film deposition apparatus has been described in the first and the second embodiments and the substrate process apparatus serving as the etching apparatus is explained in the third embodiment, the present invention may be applied to other substrate process apparatuses. For example, the present invention may be applied to a thermal process apparatus where a substrate placed on a susceptor in a vacuum chamber is heated while an inert gas is supplied to the vacuum chamber and evacuated through plural evacuation passages. In this case, because the inert gas can uniformly flow in the vacuum chamber by preparing the table 86 in advance and outgases emitted from the substrate can be uniformly evacuated from the vacuum chamber, uniform thermal process can be realized.

Although the invention has been described in conjunction with the foregoing specific embodiment, many alternatives, variations and modifications will be apparent to those of ordinary skill in the art. Those alternatives, variations and modifications are intended to fall within the scope of the appended claims.

What is claimed is:

1. A substrate process apparatus that performs a process with respect to a substrate under vacuum by supplying a process gas from a process gas supplying portion to the substrate placed on a susceptor in a vacuum chamber, the substrate process apparatus comprising:

first and second evacuation passages through which the vacuum chamber is evacuated;

a first pressure adjustment valve provided in the first evacuation passage;

a second pressure adjustment valve provided in the second evacuation passage;

a conductance adjustment portion provided in the second evacuation passage between the vacuum chamber and the second pressure adjustment valve in order to adjust conductance of the second evacuation passage, the second evacuation passage being divided by the conductance adjustment portion into a primary side located between the vacuum chamber and the conductance adjustment portion and a secondary side located between the second pressure adjustment valve and the conductance adjustment portion;

a first pressure measurement instrument for measuring a pressure in the vacuum chamber;

a differential pressure measurement portion that measures a differential pressure between the primary side and the secondary side of the second evacuation passage;

a storage portion that stores data prescribing a relationship of the pressure in the vacuum chamber, an adjustment value of the conductance adjustment portion, a flow rate of gas to be evacuated through the second evacuation passage, and the differential pressure; and a control portion that reads out the pressure in the vacuum chamber, the adjustment value of the conductance adjustment portion, and the differential pressure which correspond to a set value of the flow rate of gas to be evacuated through the second evacuation passage from the data stored in the storage portion, and outputs instruction signals to the first pressure adjustment valve in order to adjust the pressure in the vacuum pressure to be the pressure read out from the data, to the conductance adjustment portion in order to adjust conductance in the second evacuation passage to be the adjustment value read out from the data, and to the second pressure adjustment valve in order to adjust a differential pressure across the conductance adjustment portion to be the differential value read-out from the data, wherein the each of the first and second evacuation passages is configured to separately evacuate different kinds of reaction gases, wherein the vacuum chamber includes a first evacuation port and a second evacuation port, the first evacuation port being connected to the first evacuation passage and the second evacuation port being connected to the second evacuation passage, and wherein the first and second evacuation ports are located in different positions with respect to a rotation direction of the susceptor.

2. The substrate process apparatus of claim 1, wherein the conductance adjustment portion is a butterfly valve, and the adjustment value of the conductance is an opening degree of the butterfly valve.

3. The substrate process apparatus of claim 1, wherein the process is a film deposition process performed by carrying out a cycle of alternately supplying at least two kinds of the reaction gases that react with each other to the substrate to produce a layer of a reaction product, thereby forming a film on the substrate, the substrate process apparatus further comprising:

a first reaction gas supplying portion and a second reaction gas supplying portion that are arranged away from each other in a circumferential direction of the vacuum chamber, and supply a first reaction gas and a second reaction gas to the substrate on the susceptor, respectively;

a separation area that is arranged between a first process area where the first reaction gas is supplied and a second process area where the second reaction gas is supplied, and supplies separation gas from a separation gas supplying portion, thereby separating atmospheres of the first process area and the second process area, and a rotation mechanism that rotates the susceptor and a combination of the first reaction gas supplying portion, the second reaction gas supplying portion, and the separation area in relation to each other, so that the substrate can be positioned in the first process area, the separation area, and the second process area in this order, wherein the first evacuation passage is provided so that the first reaction gas and part of the separation gas are evacuated through the first evacuation passage, and the second evacuation passage is provided so that the second reaction gas and remaining part of the separation gas are evacuated through the second evacuation passage.

4. The substrate process apparatus of claim 1, wherein the data in the storage portion are obtained before the process is performed with respect to the substrate, by the steps of (a) closing the first pressure adjustment valve and opening the second pressure adjustment valve, (b) supplying a flow rate control gas to the vacuum chamber, adjusting the adjustment value of the conductance adjustment portion so that the pressure in the vacuum chamber becomes substantially equal to a predetermined pressure, and obtaining the adjustment value of the conductance adjustment portion and the differential pressure, and (c) repeating the steps (a) and (b) for plural combinations of a flow rate of the flow rate adjustment gas and the pressure in the vacuum chamber.

5. The substrate process apparatus of claim 1, wherein each of the first and second evacuation passages is independently formed so that the first and second evacuation passages do not connect to each other.

6. The substrate process apparatus of claim 3, wherein the separation area is located between the first and second evacuation ports in the rotation direction of the susceptor.

* * * * *